(12) United States Patent
Han et al.

(10) Patent No.: US 7,056,471 B1
(45) Date of Patent: Jun. 6, 2006

(54) TERNARY AND QUARTERNARY NANOCRYSTALS, PROCESSES FOR THEIR PRODUCTION AND USES THEREOF

(75) Inventors: Mingyong Han, Singapore (SG); Xinhua Zhong, Singapore (SG); Wolfgang Knoll, Singapore (SG)

(73) Assignee: Agency for Science Technology & Research, Singapore (SG)

( * ) Notice: Subject to any disclaimer, the term of this patent is extended or adjusted under 35 U.S.C. 154(b) by 0 days.

(21) Appl. No.: 10/321,278

(22) Filed: Dec. 16, 2002

(51) Int. Cl.
*C22C 18/00* (2006.01)
(52) U.S. Cl. ............... 420/523; 420/525; 420/579; 436/81
(58) Field of Classification Search .............. 420/523, 420/525, 579
See application file for complete search history.

(56) References Cited

U.S. PATENT DOCUMENTS

| | | | |
|---|---|---|---|
| 6,207,392 B1 | 3/2001 | Weiss et al. | 435/7.1 |
| 6,225,198 B1 * | 5/2001 | Alivisatos et al. | 438/497 |
| 6,306,610 B1 | 10/2001 | Bawendi et al. | 435/7.1 |
| 6,322,901 B1 | 11/2001 | Bawendi et al. | 428/548 |
| 6,326,144 B1 | 12/2001 | Bawendi et al. | 435/6 |
| 6,423,551 B1 | 7/2002 | Weiss et al. | 436/518 |
| 6,426,513 B1 | 7/2002 | Bawendi et al. | 257/13 |
| 6,444,143 B1 | 9/2002 | Bawendi et al. | 252/301.6 |
| 6,617,583 B1 * | 9/2003 | Bawendi et al. | 250/370.01 |

FOREIGN PATENT DOCUMENTS

| | | |
|---|---|---|
| EP | 0 977 212 A2 | 2/2000 |
| EP | 1 209 695 A1 | 11/2000 |
| WO | 2001/054923 | 7/2004 |

OTHER PUBLICATIONS

Colvin, V.L., et al., "Light-emitting diodes made from cadmium selenide nanocrystals and a semiconducting polymer," Nature, vol. 370, pp. 354-357, Aug. 4, 1994.

Tessler, Nir, et al., "Efficient Near-Infrared Polymer Nanocrystal Light-Emitting Diodes,", Science, vol. 295, pp. 1506-1508, Feb. 22, 2002.

Klimov, V.I., et al., "Optical Gain and Stimulated Emission in Nanocrystal Quantum Dots," Science, vol. 290, pp. 314-317, Oct. 13, 2000.

Huynh, Wendy U., et al., "Hybrid Nanorod-Polymer Solar Cells," Science, vol. 295, pp. 2425-2427, Mar. 29, 2002.

Bruchez, Jr., Marcel, et al., "Semiconductor Nanocrystals as Fluorescent Biological Labels," Science, vol. 281, pp. 2013-2016, Sep. 25, 1998.

(Continued)

*Primary Examiner*—George Wyszomierski
(74) *Attorney, Agent, or Firm*—Greg J. Hollrigel; Stout, Uxa, Buyan & Mullins, LLP

(57) ABSTRACT

The present invention relates to nanocrystals consisting of a homogeneous ternary or quaternary alloy having the composition $M1_{1-x}M2_xA$ and $M1_{1-x}M2_xA_yB_{1-y}$, respectively, a process for its production, as well as to uses of such nanocrystals such as as short wavelength light-emitting devices, and in the detection of analytes, in particular biomolecules.

25 Claims, 11 Drawing Sheets

OTHER PUBLICATIONS

Klarreich, Erica, "Biologists join the dots," Nature, vol. 413, pp. 450-452, Oct. 4, 2001.

Murray, C.B., et al., "Synthesis and Characterization of Nearly Monodisperse Cd (E=S, Se, Te) Semiconductor Nanocrystallites," J. Am. Chem. Soc., vol. 115, pp. 8706-8715, 1993.

Hines, Margaret, et al., "Synthesis and Characterization of Strongly Luminescing ZnS-Capped CdSe Nanocrystalis," J. Phys. Chem, vol. 100, pp. 468-471, 1996.

Peng, Xiaogang, et al., "Epitaxial Growth of Highly Luminescent CdSe/CdS Core/Shell Nanocrystals with Photostability and Electronic Accessibility," J. Am. Chem. Soc., vol. 119, pp. 7019-7029, 1997.

Dabbousi, B.O., et al., "(CdSe)ZnS Core—Shell Quantum Dots: Synthesis and Characterization of a Size Series of Highly Luminescent Nanocrystallites," J. Phys. Chem. B, pp. 9463-9475, 1997.

Talapin, Dmitri V., et al., "Highly Luminescent Monodisperse CdSe and CdSe/ZnS Nanocrystal Synthesized in a Hexadecylamine-Trioctylphosphine Oxide-Trioctylpospine Mixture," Nano Letters, vol. 1, No. 4, pp. 207-211, Jan. 30, 2001.

Qu, Lianhua, et al., "Control of Photoluminescence Properties of CdSe Nanocrystals in Growth," J. Am. Chem. Soc., vol. 124, No. 9, pp. 2049-2055, 2002.

Korgel, Brian A., et al., "Controlled Synthesis of Mixed Core and Layered (Zn,Cd)S and (Hg,Cd)S Nanocrystals within Phosphatidylcholine Vesicles," Langmuir, vol. 16, pp. 3588-3594, 2000.

Petrov, D.V., et al., "Size and Band-Gap Dependences of the First Hyperpolarizability of CdxZn1-xS Nanocrystals," J. Phys. Chem. B., vol. 106, pp. 5325-5334, 2002.

Harrison, M.T., et al., "Wet chemical synthesis and spectroscopic study of CdHgTe nanocrystals with strong near-infrared luminescence," Materials Science and Engineering B69, pp. 355-360, 2000.

Seedorf, T., et al., "Comparative study of molecular bean and migration-enhanced epitaxy of ZnCdSe quantum wells: influence on interface and composition fluctuations," Journal of Crystal Growth, vol. 214/215, pp. 602-605, 2000.

Shan, C.X., et al., "Growth and evolution of ZnCdSe quantum dots," J. Vac. Sci. Technol. B 20(3), pp. 1102-1106, 2002.

Wang, Wenzhong, et al., "Room-Temperature Synthesis and Characterization of Nanocrystalline CdS, ZnS, and CdxZn1-xS," Chem. Mater., vol. 14, pp. 3028-3033, 2002.

Cao, Yun Wei, et al., "Growth and Properties of Semiconductor Core/Shell Nanocrystals with InAs Cores," J. Am. Chem. Soc., vol. 122, pp. 9692-9702, 2000.

Bailey, Robert E., et al., "A New Class of Far Red and Near-Infrared Biological Labels Based on Alloyed Semiconductor Quantum Dots," Journal of Nanoscience and Nanotechnology, 2001, vol. 4, No. 6, p. 569-574.

Bailey, Robert E., et al., "Alloyed Semiconductor Quantum Dots : Tuning the Optical Properties without Changing the Particle Size," Journal of the American Chemical Society, 2003, 125, p. 7100-7106.

Bailey, Robert E., et al., "Quantum dots in biology and medicine," Physica E, 25( 2004), p. 1-12.

Zhong, X. et al., "Composition-Tunable $Zn_xCd_{1-x}Se$ Nanocrystals with High Luminescence and Stability", J. Am. Chem. Soc., 2003, 125:8589-8594.

Zhong, X., et al., "Embryonic Nuclei-Induced Alloying Process for Reproducible Synthesis of Blue-Emitting $Zn_xCd_{1-x}Se$ Nanocrystals with Long-Time Thermal Stability in Size Distribution and Emission Wavelength", J. Phys. Chem. B., 2004, 108:15552-15559.

Zhong, X., et al., "Alloyed $Zn_xCd_{1-x}S$ Nanocrystals with Highly Narrow Luminescense Spectral Width", J. Am. Chem. Soc., 2003, 125:13559-13563.

* cited by examiner (A)

(B)

(A)

(B)

(A)

(B)

(A)

(B)

SCHEME II

SMART NANOSTRUCTURES
Lab-on-a-Bead

Optical codes for target identification

Molecular recognition for target selection (A)

SCHEME III

SINGLE-BEAD READOUT (B)

TERNARY AND QUARTERNARY NANOCRYSTALS, PROCESSES FOR THEIR PRODUCTION AND USES THEREOF

The present invention relates to nanocrystals consisting of a homogeneous ternary or quaternary alloy having the composition $M1_{1-x}M2_xA$ and $M1_{1-x}M2_xA_yB_{1-y}$, respectively; processes for their production; as well as uses of such nanocrystals, including but not limited to short wavelength light-emitting devices, and the detection of analytes, in particular biomolecules. The present invention also relates to compositions and kits containing such nanocrystals which can be used in the detection of analytes such as nucleic acids, proteins or other biomolecules, and in various analytical and biomedical applications such as visualization of biological materials or processes, e.g., in tissue or cell imaging, in vitro or in vivo.

Semiconductor nanocrystals (quantum dots) have been receiving great fundamental and technical interest for their use in light-emitting devices (Colvin et al, *Nature* 370, 354–357, 1994; Tessler et al, *Science* 295, 1506–1508, 2002), lasers (Klimov et al, *Science* 290, 314–317, 2000), solar cells (Huynh et al, Science 295, 2425–2427, 2002) or as fluorescent biological labels in biochemical research areas such as cell biology. See for example, Bruchez et al, Science, Vol. 281, pages 2013–2015, 2001; Chan & Nie, Science, Vol. 281, pages 2016–2018, 2001; U.S. Pat. No. 6,207,392, summarized in Klarreich, Nature, Vol. 43, pages 450–452, 2001; see also Mitchell, Nature Biotechnology, pages 1013–1017, 2001, and U.S. Pat. Nos. 6,423,551, 6,306,610, and 6,326,144.

The primary reason for the interest in these II-VI semiconductor nanocrystals is their size-tunable photoluminescence (PL) emission spanning the whole visible spectrum. A single light source can be used for simultaneous excitation of all different-sized dots, and their emission wavelength can be continuously tuned by changing the particle size. Together with their ability to be conjugated to biomolecules such as proteins or nucleic acids, this photoluminescence makes them attractive alternatives for organic fluorescent dyes classically used in biomedical applications. With well-established high-temperature organometallic synthetic methods (Murray et al, *J. Am. Chem. Soc.* 115, 8706–8715 1993), CdSe nanocrystals have become the most extensively investigated quantum dots (QD) because of their size-tunable photoluminescence (PL) across the visible spectrum.

Major problems encountered over the years in making high-quality quantum dots are associated with materials issues. In particular, there has been a tendency to form defects and surface-trap states under growth conditions, resulting in low luminescence and stability. Surface-passivation of the CdSe nanocrystals with suitable organic or inorganic materials can minimize this problem by removing the nonradiative recombination centers. The best PL quantum yield reported for CdSe QDs can reach over 50% in the wavelength window above 520 nm, but the efficiency for the blue window is still low (Hines et al, *J. Phys. Chem.* 100, 468–471 (1996); Peng et al, *J. Am. Chem. Soc.* 119, 7019–7029 (1997); Dabbousi et al, *J. Phys. Chem. B* 101, 9463–9475 (1997); Talapin et al, *Nanolett.* 1, 207–211 (2001); Qu et al, *J. Am. Chem. Soc.* 124, 2049–2055 (2002) and U.S. Pat. No. 6,322,901 B1).

For inorganic passivation, these nanocrystals have a so-called core-shell structure or capped structure, consisting usually of a core made of semiconducting cadmium selenide, which is coated with an (insulating) (wider band gap semiconductor) inorganic outer shell, usually made of zinc sulfide or cadmium sulfide (FIG. 7, cf. also FIG. 1 of Chan & Nie, supra).

By this approach, i.e. passivating the surface of the cadmium selenide nanocrystal by an insulating outer shell, the excitons used to create the photoluminescence can be confined to this core, which reduces—among other effects—the tendency of the CdSe nanocrystals to form defects under growth conditions, and photochemical degradation, thereby leading to improved emission efficiencies and stabilities. The use of this core shell structure is also considered to be advantageous over the second method used so far for passivation of the surface of a nanocrystal, which is the passivation of the semiconductor surface with organic materials. The latter method, described for instance in U.S. Pat. Nos. 6,426,513 and 6,444,143, yields insufficient passivated nanoparticles that are lower luminescent in aqueous solutions and which thus render such coated nanoparticles unsuitable for most biological applications (Chan & Nie, supra).

Furthermore, organic passivation is often incomplete or reversible. The luminescence of organically passivated CdSe nanocrystals will dramatically decrease when capping materials such as alkylamine or trioctylphosphine oxide are displaced to make them water-soluble. This greatly limits their functionality in biomedical labeling application.

Effective inorganic-passivation, analogous to the growth of 2D quantum wells, can form more robust core-shell structured QDs (such as CdSe/ZnS and CdSe/CdS) against chemical degradation or photooxidation than the organic-coated QDs ((Hines et al, *J. Phys. Chem.* 100, 468–471 (1996); Peng et al, *J. Am. Chem. Soc.* 119, 7019–7029 (1997); Dabbousi et al, *J. Phys. Chem. B* 101, 9463–9475 (1997)). However, large lattice mismatch between core and shell structures leads to the accumulation of interface strain that can dramatically increase with shell thickness. Eventually such strain can be released through the formation of misfit dislocations that degrade optical properties.

However, despite the improvements they have provided, these core-shell structured CdSe nanoparticles still show an insufficient long-term stability and thus also insufficient luminescence in aqueous solution. Furthermore, no economical way has been found to mass-produce such nanoparticles. Consequently, it remains a major goal to develop new synthetic methods or strategies of producing highly luminescent stable QDs in general, especially those that are blue-emitting.

Summarizing the above results, in the last two decades the focus has been on the preparation of different color-emitting QDs with different particle sizes. An alternative approach is to make different color-emitting QDs through control of metal stoichiometries in alloyed QDs. Although bulk or thin film semiconductor alloys have been extensively investigated due to their wide application in optoelectronics, only a limited number of studies have been reported for the preparation of null dimensional ("OD") colloidal alloy nanocrystals with poor PL properties by co-precipitation or slow diffusion of their constituents in wet chemistry routes (Korgel et al, *Langmuir* 16, 3588–3594 (2000); Petrov et al, *J. Phys. Chem. B* 106, 5325–5334 (2002); Harrison et al, *Mat. Sci. Eng. B* 69, 355–360 (2000)).

First, several scientific studies exist on ternary quantum wells or quantum dots which were not by wet-chemistry approaches. Seedorf et al, Journal of Crystal Growth 214/215, pages 602–605 (2000) report on a study of molecular beam and migration-enhanced epitaxy of ZnCdSe quantum wells. In this study, heterostructures are described consisting of a single ZnCdSe quantum well embedded between a 500 nm thick lattice matched $Zn_{0.06}S_{0.94}Se$ buffer layer and a 50 nm thick $Zn_{0.06}S_{0.94}Se$ cap layer, wherein both layers were grown by molecular beam epitaxy. Shan et al, Journal of Vacuum Science and Technology B 20, pages 1102–1106 (2002) report growth and evolution of ZnCdSe quantum dots on GaAs (100) substrates by metalorganic chemical vapour deposition.

Several nanoalloys prepared by these chemical approaches are listed as follows to show their weak P1 properties. Harrison et al, Materials Science and Engineering B69–70, pages 355–360 (2000) describe the chemical synthesis of CdHgTe nanocrystals. The crystals were obtained using a wet-chemical synthesis colloidal technique using CdTe nanocrystal precursors stabilized with 1-mercapto,2-3-propanediol to which subsequent layers of HgTe and CdTe were added. According to Harrison et al., CdTe/HgTe core/shell nanocrystals, as well as a CdHgTe system which seemed to be a solid solution with perhaps a concentration gradient across the "radius" of the particle, were formed.

Finally, Korgel and Monbouquette, Langmuir (2000), pages 3588–3594, describe the synthesis of mixed core and layered (Zn,Cd)S and (Hg,Cd)S nanocrystals within phosphatidylcholine vesicles. According to the authors, these nanocrystals were obtained by two approaches. The first was coprecitation of two different cation species within the phosphatidylcholine vesicle to obtain particles with mixed core compositions. The second one was first synthesized as a pure CdSe nanocrystal within the vesicle interior which was to serve as a template to grow an outer shell of either HgS or ZnS. The mixed core compositions are reported to have stochiometries of $Zn_yCd_{1-y}S$ and $Hg_yCd_{1-y}S$ with y having values between y=0.14 and 0.61 in the $Zn_yCd_{1-y}S$ system, and y=0.0025 and 0.75 in the $Hg_yCd_{1-y}S$ system. According to the authors, such mixed core compositions were not observed to agglomerate immediately after micellization, which was carried out for the optical characterization. However, if the dispersion was allowed to sit for several hours, the size distribution appeared to broaden, indicating an instability of the core compositions.

Moreover, Wang et al., Chemistry of Materials (2002) 14, pages 3028–3033, describe another preparation of $Cd_xZn_{1-x}S$ by co-precipitating $ZnCl_2$ and $CdCl_2$ in ethanol solution containing $KBH_4$ and $CS_2$ at room temperature. According to the authors, $KBH_4$ serves as a reducing agent which reduces elemental S first to $S^{2-}$, which can then react with $Cd^{2+}$ or $Zn^{2+}$ to form CdS or ZnS. The reaction is said to be rather dependent on the particular solvent used therein, since the critical role played by the solvent, according to Wang et al., is to complex $Zn^{2+}$ or $Cd^{2+}$ in order to prevent reduction of the metal ions by $KBH_4$.

So far quantum dots have not been successfully prepared having a narrow size distribution, good crystallinity, high luminescence efficiency and at the same time narrow, symmetric emission spectra and a good stability. Rather, known quantum dots or nanoalloys have only very weak luminescence with very broad and unsymmetrical emission peak shape.

Therefore, there is still the necessity for nanocrystals with high luminescence and stability in aqueous solution, that are also easy to produce. There also remains the need for blue-emitting quantum dots which are useful as short-wavelength light-emitting devices. Consequently, it also remains a major goal to develop new synthetic methods or strategies of producing highly luminescent stable QDs, especially blue-emitting ones.

Accordingly, it is an object of the invention to overcome the limitations of the prior art and to provide nanocrystals that meet the above needs.

This object is solved by the nanocrystals and the processes of producing nanocrystals having the features of the respective independent claims.

In one embodiment such a nanocrystal is a nanocrystal consisting of a homogeneous ternary alloy having the composition $M1_{1-x}M2_xA$, wherein a) M1 and M2 are independently selected from an element of the subgroup IIb, subgroup VIIa, subgroup VIIIa, subgroup Ib or main group II of the periodic system of the elements (PSE), when A represents an element of the main group VI of the PSE, or b) M1 and M2 are independently selected from an element of the main group (III) of the PSE, when A represents an element of the main group (V) of the PSE.

This nanocrystal is obtainable by a process comprising i) forming a binary nanocrystal M1A by heating a reaction mixture containing the element M1 in a form suitable for the generation of a nanocrystal to a suitable temperature T1, adding at this temperature the element A in a form suitable for the generation of a nanocrystal, heating the reaction mixture for a sufficient period of time at a temperature suitable for forming said binary nanocrystal M1A and then allowing the reaction mixture to cool, and ii) reheating the reaction mixture, without precipitating or isolating the formed binary nanocrystal M1A, to a suitable temperature T2, adding to the reaction mixture at this temperature a sufficient quantity of the element M2 in a form suitable for the generation of a nanocrystal, then heating the reaction mixture for a sufficient period of time at a temperature suitable for forming said ternary nanocrystal $M1_{1-x}M2_xA$ and then allowing the reaction mixture to cool to room temperature, and isolating the ternary nanocrystal $M1_{1-x}M2_xA$.

Alternatively the following procedure in i) can be: forming a binary nanocrystal M1A by heating a reaction medium (or a mixture of media) in a form suitable for the generation of a nanocrystal to a suitable temperature T1, adding at this temperature the element M1 and A in a form suitable for the generation of a nanocrystal, heating the reaction mixture for a sufficient period of time at a temperature suitable for forming said binary nanocrystal M1A and then allowing the reaction mixture to cool. Step ii) is then carried out as above.

Yet another version of step i) is: forming a binary nanocrystal M1A by heating a reaction mixture containing the element A in a form suitable for the generation of a nanocrystal to a suitable temperature T1, adding at this temperature the element M1 in a form suitable for the generation of a nanocrystal, heating the reaction mixture for a sufficient period of time at a temperature suitable for forming said binary nanocrystal M1A and then allowing the reaction mixture to cool. In this alternative, step ii) is then carried out as stated above.

Besides the above described process that comprises two separate steps in the synthesis of a ternary nanocrystal (which are also referred to as nanoalloys), which can also be considered as a "quasi-one-pot reaction", cf. Example 1, the nanocrystal of the invention is also obtainable by a "one-pot-reaction". This second process comprises:

i) providing a reaction mixture containing the elements M1, M2 and A each in a form suitable for the generation of a nanocrystal, ii) heating the reaction mixture for a sufficient period of time at a temperature suitable for forming said ternary nanocrystal M1M2A and then allowing the reaction mixture to cool, and iii) isolating the ternary nanocrystal $M1_{1-x}M2_xA$.

When using a reaction mixture comprising not only one element A but a mixture of several suitable elements, the above "one-pot-reaction" provides an easy and elegant way to form quarternary nanoalloys of the general formula $M1_{1-x}M2_xA_yB_{1-y}$. Accordingly, the present invention is also directed to a nanocrystal consisting of a homogeneous quarternary alloy having the composition $M1_{1-x}M2_xA_yB_{1-y}$, wherein a) M1 and M2 are independently selected from an element of subgroup IIb, subgroup VIIa, subgroup VIIIa, subgroup Ib or main group II of the periodic system of the elements (PSE), when A and B both represent an element of the main group VI of the PSE, or b) M1 and M2 are independently selected from an element of the main group (III) of the PSE, when A and B both represent an element of the main group (V) of the PSE.

In preferred embodiments of the ternary as well as the quarternary nanoalloys of the invention, M1 and M2 are independently selected from the elements of the subgroup IIb, i.e. Zn, Cd or Hg. In case an element is of subgroup VIIa (Mn, Tc, Re), the element is preferably Mn. Elements of subgroup VIIIa which are preferably present in the nanocrystals of the invention are Fe, Co and Ni. From the subgroup Ib all elements, i.e. Cu, Ag and Au are equally preferred. In one embodiment of the quarternary nanocrystals, M1 and M2 are selected from the same (sub)group of the PSE. Preferred elements of the main group II in the nanocrystals of the invention are Mg, Ca and Ba.

As can be taken from the above disclosure, the invention is based on the surprising finding of the inventors that, when making use of the "quasi-one-pot reaction", omitting the step of precipitating binary nanocrystals such as CdSe or CdS in the standard synthesis by a reagent such as anhydrous methanol (see, for example, Murray et al., J. Am. Chem. Soc. 115, 8706–8715 (1993) or Peng et al, J. Am. Chem. Soc. 119, 7019–7029 (1997)) renders binary nanocrystals of the so-called group II-VI nanocrystals and the group III-V nanocrystals suitable for forming a ternary alloy in the second reaction step. Accordingly, as it can be seen from the second method of the present invention, the process of the invention for making a ternary nanocrystal (which can also be called nanoalloys) can be carried out as a one pot reaction contrary to methods known for the preparation of the common core-shell nanocrystals. Without being bound by theory, the inventors believe that the precipitation step in the standard synthesis of these binary nanocrystals leads to modifications of the surface of the synthesized nanocrystals which prevent the formation of a ternary alloy (cf. Example 1).

The inventors have surprisingly further found that the ternary or quaternary nanocrystals of the invention have many advantages compared to core-shell nanocrystals. First, with the alloyed ternary nanocrystals in particular, as well as with others, blue-emitting quantum dots are much more stable than core-shell structures and can be stored in aqueous solutions for more than five months without observing changes in the photoluminescence emission. Second, the ternary or quaternary nanocrystals or nanoalloys are also chemically more stable and can undergo heat treatment at elevated temperatures such as 80° C. in air-saturated aqueous solution for even two days without any shift in the emission maximum or without significant decrease of the photoluminescence yield (cf. Example 4, FIG. 5). Third, the size of the nanocrystals disclosed here can be tuned quite exactly by varying the ratio of the elements M1 and M2 in the ternary or quarternary alloy, meaning that the optical properties, in particular the emission spectrum, can also be adjusted very accurately within the desired range. Fourth, and most surprisingly, distinct from core-shell nanocrystals, the absorption and emission maximum of which are shifted to longer wavelengths with increasing particle size (i.e. a so-called red-shift occurs), the absorption and emission maximum of the ternary and quaternary nanocrystals of the invention can be shifted to shorter wavelengths (i.e. a so-called blue-shift occurs). This means the nanoalloys of the present invention usually have a bigger size than core-shell or non-passivated binary nanocrystals. This increased size leads in turn to an increased stability which is advantageous for many practical applications, exemplified by, but not limited to the following. A ternary nanocrystal of the invention with the composition $Zn_{0.67}Cd_{0.33}Se$ that emits blue light has a diameter of 7.2 nm, whereas the corresponding CdSe nanocrystal having a ZnSe shell emitting blue light has a diameter of ~2 nm, i.e. is about three times smaller than the ternary nanocrystals disclosed here. Blue-emitting in more short emission wavelengths will have relative larger nanoalloys.

These properties render the nanoalloys of the invention ideal materials for a new class of fluorescent biomedical labels/tags, providing unique properties that are not possible with organic dye probes or probes based on core-shell nanocrystals for ultrasensitive, multicolor, and multiplexing applications. In particular, these properties include but are not limited to size-tunable emission, simultaneous excitation, high stability, and narrow and symmetric emission. The highly luminescent stable nanoalloys, in particular those that are blue-emitting, are ideal materials for short-wavelength light-emitting devices and quantum dot lasers, which could solve problems occurring in the promising, but highly strained, $Zn_xCd_{1-x}Se/ZnSe$ quantum-well structures. These nanoalloys are also a new class of biomedical labels for ultra-sensitive, multicolor, and multiplexing applications.

As it can be seen from the properties of the nanocrystals of the invention, they constitute a novel class of nanocrystals. This holds true even for these ternary nanocrystals or nanoalloys of the invention that may have the same stoichiometric composition as the CdHgTe nanocrystals described by Harrison et al, supra (the stoichiometry of which is not known) the $Zn_yCd_{1-y}S$ system (with y=0.14, 0.15, 0.25, 0.34, 0.44, 0.61) and $Hg_yCd_{1-y}S$ system (with y=0.0025, 0.005, 0.05, 0.01, 0.2, 0.5, 0.75) described by Korgel and Monbouquette, supra, and the $Cd_xZn_{1-x}S$ (with x=0.95, 0.8, 0.72, 0.22, 0.10) nanoparticles described by Wang. Accordingly, the CdHgTe nanocrystals described by Harrison et al, and the $Zn_yCd_{1-y}S$ and $Hg_yCd_{1-y}S$ system described by Korgel and Monbouquette and the $Cd_xZn_{1-x}S$ nanoparticles described by Wang do not belong to the present invention.

In the ternary as well as the quaternary nanocrystals of the present invention, the index x has a value of 0.001<x<0.999, preferably of 0.1<x<0.99 or more preferred of 0.1<x<0.95. In even more preferred embodiments, x can have a value between about 0.2 or about 0.3 to about 0.8 or about 0.9. In the quaternary nanocrystals, y has a value of 0.001<y<0.999, preferably of 0.01<y<0.99, or more preferably of 0.1<x<0.95 or between about 0.2 and about 0.8.

In the so-called II-VI nanocrystals of the present invention, the elements M1 and M2 comprised therein are preferably independently selected from the group consisting of Zn, Cd and Hg. The element A of the group VI of the PSE in these ternary alloys is preferably selected from the group consisting of S, Se, and Te. Thus, all combinations of these elements M1, M2 and A are within the scope of the invention. Preferred embodiments are nanoalloys having the composition $Zn_xCd_{1-x}Se$, $Zn_xCd_{1-x}S$, $Zn_xCd_{1-x}Te$, $Hg_xCd_{1-x}Se$, $Hg_xCd_{1-x}Te$, $Hg_xCd_{1-x}S$, $Zn_xHg_{1-x}Se$, $Zn_xHg_{1-x}Te$, and $Zn_xHg_{1-x}S$.

In this respect, it is noted that the designation M1 and M2 can be used interchangeably throughout the present application, for example in an alloy comprising Cd and Hg, either of which can be named M1 or M2. Likewise, the designation A and B for elements of group V or VI of the PSE are used interchangeably; thus in an quaternary alloy of the invention Se or Te can both be named as element A or B.

In particularly preferred embodiments, the nanocrystals of the invention have the composition $Zn_xCd_{1-x}Se$. Such nanocrystals are preferred in which x has a value of $0.15<x<0.85$, and more preferably a value of $0.2<x<0.8$.

In case of III-IV nanocrystals of the invention, the elements M1 and M2 are preferably independently selected from Ga and Indium. The element A is preferably selected from P, As and Sb.

In the quaternary nanoalloys of the invention the same elements are present. Examples of quaternary alloys are $Zn_{1-x}Cd_xSe_yTe_{1-y}$, $Zn_{1-x}Cd_xSe_yS_{1-y}$, $Hg_{1-x}Cd_xSe_yS_{1-y}$, $Hg_{1-x}Cd_xSe_yTe_{1-y}$. (II-VI-nanoalloys) or $Ga_{1-x}In_xP_yAs_{1-y}$ (III-V-nanocrystals).

In the "quasi-one-pot-process" of the invention, the reaction mixture is allowed to cool down or is actively cooled down after formation of the binary nanocrystals M1A to any temperature that is suitable for handling the reaction mixture for step ii. In a preferred embodiment, the reaction mixture is allowed to cool to a temperature below 100° C., more preferably 50° C., and most preferably to room temperature, which means about 20 to 25° C., or even below room temperature, after formation of the binary nanocrystals M1A.

The reaction mixture in step i) of this process is heated to a temperature T1 between about 150° C. and about 400° C., preferably between about 260° C. and about 340° C., or more preferably to about 310° C. In step ii) of this process the reaction mixture is heated to a temperature between about 200° C. and about 400° C., preferably to a temperature between about 270° C. and about 310° C. Both of the steps are preferably carried out in a solution, and usually under an inert atmosphere such as an argon, nitrogen, helium or xenon atmosphere. In step ii) a second quantity of the element A can be added for the formation of the ternary nanocrystal, depending on the desired stoichiometry. The addition of a second quantity of the element A (which can be present in a suitable precursor) is usually considered if x is larger than about 0.4. In another version, the unreacted amount of A in the reaction mixture can serve as the source of A needed for the formation of the ternary nanocrystal. In this respect, it should be noted that it is not necessary to exactly predetermine the needed amounts of the different components. Rather, due to the fact that the nanocrystals of the invention absorb and emit radiation in the near UV to near infrared, and preferably in the visible range of the electromagnetic spectrum, the reaction can be easily followed by spectroscopic means. Therefore, the element A or M2 can be added in excess, and once the nanocrystals in the reaction mixture emit at a desired wavelength, the reaction can be stopped, for example by cooling down the reaction mixture and/or precipitating the formed tertiary or quarternary nanocrystals.

The heating phase in step ii) of the "quasi-one-pot" reaction can thus be carried out for any time that is sufficient in order to yield the desired composition. Usually, the step ii) is carried out for a time period between about 2 and about 30 min, preferably between about 10 and about 15 min.

The elements M1, M2, A and B can be used in the present invention, i.e. in any of the methods disclosed here, in any form that is suitable for the generation of a nanocrystal. Such forms, which can are also called precursors or precursor molecules, are known to the skilled person. Examples of the numerous suitable forms of the elements M1 and M2 are organometallic compounds, for example, alkylated compounds such an dimethylzinc ($ZnMe_2$), diethylzinc ($ZnEt_2$), dimethylcadmium ($CdMe_2$) or dimethylmercury ($HgMe_2$), or as salts or long chain alkyl carboxylic acids such as cadmium stearate. The elements A and B can be employed in the processes of the present invention in the form of known phosphine compounds such as trioctylphosphine selenide (TOPSe), and trioctylphosphine telluride (TOPTe). These precursors can be synthesized and used as stock solutions or made in situ. Suitable precursor molecules of M1, M2, A and B as defined here, and the preparation thereof, are described in Murray et al., supra; Cao and Banin, J. Am. Chem. Soc. 122, pages 9692–9702, (2000); Peng et al, supra, Dabboussi et al, J. Phys. Chem. B, 101, pages 9643–9475, (1997), or U.S. Pat. No. 6,322,901 for instance, the contents of all of which are hereby incorporated by reference.

Since the methods of synthesis of the present invention are insensitive to the solvent (contrasting, for example, to the method of Wang et al., supra), a wealth of suitable high boiling point solvents exist that can be used as reaction media in all of the methods of the present invention. Among the different types of solvents that can be used are alkyl phosphine/phosphine oxide/phosphite/phosphate/amine/phosphonic acid/ether/alkane, etc.

Specific examples of suitable solvents and solvent mixtures include but are not limited to trioctylphosphine, tributylphosphine, tri(dodecyl)phosphine, trioctylphosphine oxide, trioctylphosphine oxide, trioctylphosphine oxide, dibutyl-phosphite, tributyl phosphite, trioctadecyl phosphite, trilauryl phosphite, tris(tridecyl) phosphite, triisodecyl phosphite, bis(2-ethylhexyl)phosphate, tris(tridecyl) phosphate, hexadecylamine, oleylamine, octadecylamine, bis(2-ethylhexyl)amine, octylamine, dioctylamine, trioctylamine, dodecylamine/laurylamine, didodecylamine tridodecylamine, hexadecylamine, dioctadecylamine, trioctadecylamine, phenylphosphonic acid, hexylphosphonic acid, tetradecylphosphonic acid, octylphosphonic acid, octadecylphosphonic acid, propylenediphosphonic acid, phenylphosphonic acid, aminohexylphosphonic acid, dioctylether, dioctyl ether/octyl ether, dodecyl ether, hexadecyl ether, octadecyl and octadecene.

Turning to the one pot reaction of the present invention, as stated above, this reaction comprises i) providing a reaction mixture containing the elements M1, M2 and A, each in a form suitable for the generation of nanocrystals, ii) heating the reaction mixture for a sufficient period of time at a temperature suitable for forming said ternary nanocrystals M1M2A and then allowing the reaction mixture to cool, and iii) isolating the ternary nanocrystals $M1_{1-x}M2_xA$. Accordingly, a reducing agent such as KBH4, which is required in the process described by Wang et al., supra, is not used in the present invention.

In one embodiment of this one-pot-process, the reaction mixture in i) is formed by preparing a solution containing one of the two elements M1 or M2 in a form suitable for the generation of a nanocrystal, heating the solution for a suitable time, then adding to the solution the element A in a form suitable for the generation of a nanocrystal, and then adding the other of the two elements M1 or M2 in a form suitable for the generation of a nanocrystal. It is also possible that the solution contains none of the element M1 or M2 before the addition of A.

In a preferred form of this embodiment, the following reaction scheme is chosen. First, M1 (or M2) is reacted with A, then a sufficient amount of each of the other element M2 (if M1 was added first) and of element A (both in a form suitable for the generation of a nanocrystal) is added and then the resulting reaction mixture is subjected to the heating in ii). The entire reaction is, as are the other solvent based methods of the invention, preferably carried out in a high boiling solvent or a mixture of such solvents.

For example, a solution of cadmium stearate can first be prepared to which trioctylphosphine is added, and this solution is then heated. Then, a selenium dissolved in trioctylphosphine and then a diethylzinc containing solution is added in order to complete the reaction mixture. (cf. Example 1.2)

In a further embodiment of this one-pot-process the reaction mixture in step i) is formed by preparing a solution containing the element A in a form suitable for the generation of a nanocrystal, heating the solution for a suitable time, then adding to this solution the two elements M1 or M2 in a form suitable for the generation of a nanocrystal.

For instance, selenium can be dissolved in a first step in trioctylphosphine and hexylamine as solvent, and then heated (cf. Example 1.3). To this solution dimethylcadmium and diethylzinc are then added, creating the reaction mixture that is then used for synthesis of the nanoalloy of the invention.

The solution in step i) containing either one of the elements M1 or M2 or the element A is preferably heated to a temperature between about 260° C. and about 340° C. However, it should be noted that if a solvent with lower boiling point is used, the inventive processes disclosed here can also be carried out at a lower temperature, as long as the desired nanocrystals are obtained.

In the step ii) of the one pot process, the reaction mixture is usually heated to a temperature between about 260° C. and about 340° C., preferably to a temperature between about 270° C. and about 340° C., and most preferably to a temperature of about 310° C.

The entire reaction, comprising steps I) and ii), are usually carried out in an inert atmosphere, wherein the same inert atmosphere as in the "quasi-one-pot reaction" described above can be used.

In addition, the present invention also refers to processes of producing a nanocrystal consisting of a homogeneous quarternary alloy having the composition $M1_{1-x}M2_xA_yB_{1-y}$ with $0.001<x<0.999$ and $0.001<y<0.999$, wherein a) M1 and M2 are independently selected from an element of the subgroup IIb, subgroup VIIa, subgroup VIIIa, subgroup Ib or main group II of the periodic system of the elements (PSE), when A and B both represent an element of the main group VI of the PSE, or b) M1 and M2 are independently both selected from an element of the main group (III) of the PSE, when A and B both represent an element of the main group (V) of the PSE, A first process comprises i) providing a reaction mixture containing the elements M1, M2, A and B each in a form suitable for the generation of nanocrystals, ii) heating the reaction mixture for a sufficient period of time at a temperature suitable for forming said quarternary nanocrystals $M1_{1-x}M2_xA_yB_{1-y}$ and then allowing the reaction mixture to cool, and iii) isolating the quarternary nanocrystal $M1_{1-x}M2_xA_yB_{1-y}$.

A second process comprises i) forming a ternary nanocrystal M1AB by heating a reaction mixture containing the element M1 in a form suitable for the generation of a nanocrystal to a suitable temperature T1, adding at this temperature the elements A and B in a form suitable for the generation of a nanocrystal, heating the reaction mixture for a sufficient period of time at a temperature suitable for forming said ternary nanocrystal M1AB and then allowing the reaction mixture to cool and ii) reheating the reaction mixture, without precipitating or isolating the formed ternary nanocrystal M1AB, to a suitable temperature T2, adding to the reaction mixture at this temperature a sufficient quantity of the element M2 in a form suitable for the generation of a nanocrystal, then heating the reaction mixture for a sufficient period of time at a temperature suitable for forming said quarternary nanocyrstal $M1_{1-x}M2_xA_yB_{1-y}$, allowing the reaction mixture to cool to room temperature, and isolating the quarternary nanocrystal $M1_{1-x}M2_xA_yB_{1-y}$.

The processes of preparing quarternary nanoalloys can be carried out in the same manner as described above for the process of preparing the ternary nanocrystals, i.e. the same reaction temperatures, solvents and/or precursors of the elements M1, M2, A and B can be used.

On a molecular level, the inventors have found that the preparation of the nanoalloys of the invention can be separated into two steps. The first step is the preparation of core nanocrystals. The second step is to incorporate further semiconductor materials into the core nanomaterials.

With respect to the high-temperature organometallic preparation in the quasi-one-pot reaction, the growth of, for example, binary M1A nanocrystals, can be stopped at anytime by removing heat. As a result, different sized cores or different color-emitting cores can be prepared by this approach. However, different amounts of free precursors for core materials can be retained in the system. It is noted that this system can be cooled down simply without any treatment. A certain amount of the as-prepared core materials is taken out and is heated to high temperature, such as about 300° C., with stirring under argon flow. At this temperature, the other two precursors M1 and A are added for alloying with core nanomaterials. The initial binary nanocrystal M1A can also be prepared by other available methods such as the wet chemistry method (Trindade et al, Chemistry of Material 2001, pages 3843–3858).

For the direct "one-pot reaction", different sized cores or different color-emitting cores can be prepared when varying the reaction time. The reaction can be from microseconds to half an hour or even longer (larger particles can be prepared with increasing reaction time). The precursors used for alloying are added at different reaction times. This approach is in particular very efficient to prepare blue-emitting quantum dots.

In accordance with the above findings, a method of synthesizing a colloidal binary M1A nanocrystal is disclosed, comprising (a) combining a metal M1 selected from the subgroup IIb, subgroup VIIa, subgroup VIIIa or subgroup Ib of the PSE with a ligand for said metal, and a coordinating solvent to form a metal complex; and (b) mixing an elemental chalcogenic precursor with the metal complex at a temperature sufficient to form nanocrystals in an reaction medium (solvent).

In this method the metal M1 is preferably selected from the group consisting of Zn, Cd, Hg, Mn, Fe, Co, Ni, and Cu.

Suitable ligands that can be employed in this method are chosen from organic amine, organic acid, phosphonic acid, phosphine oxide with long chain alkyl or aryl groups, such as docecylamine, hexadecylamine, octadecylamine, stearic acid, lauric acid, oleic acid, hexylphosphonic acid, tetra decylphosphonic acid, trioctylphosphins oxide, etc. Examples of suitable chalcogenic precursors are selected from the compounds comprising or elements consisting of S, Se, Te, P, and As. The reaction is preferable carried out at the temperature between about 150° C. and about 400° C.

Examples for useful coordinating solvents are chosen from organic amine, organic acid, phosphonic acid, phosphine oxide with long chain alkyl or aryl groups, such as docecylamine, hexadecylamine, octadecylamine, stearic acid, lauric, acid, oleic acid, hexylphosphonic acid, tetra decylphosphonic acid, trioctylphosphins oxide, etc. Reactant media (solvents) are chosen from the different types of solvents that can be used, including, but not limited to, phosphine/phosphine oxide/phosphite/phosphate/amine/phosphonic acid/ether/alkane, etc. with alkyl or aryl groups. The medium can be trioctylphosphine, tributylphosphine, tri(dodecyl)phosphine, trioctylphosphine oxide, trioctylphosphine oxide, trioctylphosphine oxide, dibutylphosphite, tributyl phosphite, trioctadecyl phosphite, trilauryl phosphite, tris(tridecyl) phosphite, triisodecyl phosphite, bis(2-ethylhexyl)phosphate, tris(tridecyl) phosphate, hexadecylamine, oleylamine, octadecylamine, bis(2-ethylhexyl) amine, octylamine, dioctylamine, trioctylamine, dodecylamine/laurylamine, didodecylamine tridodecylamine, hexadecylamine, dioctadecylamine, trioctadecylamine, phenylphosphonic acid, hexylphosphonic acid, tetradecylphosphonic acid, octylphosphonic acid, octadecylphosphonic acid, propylenediphosphonic acid, phenylphosphonic acid, aminohexylphosphonic acid, dioctylether, dioctyl ether/octyl ether, dodecyl ether, hexadecyl ether, octadecyl and octadecene.

In addition, in yet an alternative process to the solvent based methods, the nanocrystals of the present invention can be prepared by thermal alloying (cf. Example 2) This process comprises heating core-shell nanocrystals to their alloying point or to a temperature above said alloying point for a sufficient period of time. For this process any conventional core-shell quantum dot such as CdSe/ZnSe or CdSe/CdS core shell quantum dots can be used. The term "alloying point" as used herein means the very sharp temperature boundary which occurs when a homogenous alloy of a specific composition is formed. The "alloying point" is comparable to a sharp melting or boiling point of a compound and can thus easily be determined (see Example 2).

The present invention further refers to a ternary or quarternary nanocrystal, as disclosed here, conjugated to a molecule having binding affinity for a given analyte. By conjugation to a molecule having binding affinity for a given analyte, a marker compound or probe is formed in which the nanocrystal of the invention serves as a label or tag which emits radiation, preferably in the visible or near infrared range of the electromagnetic spectrum, that can be used for the detection of a given analyte.

In principle every analyte can be detected for which a specific binding partner exists that is able to at least somewhat specifically bind to the analyte. The analyte can be a chemical compound such as a drug (e.g. Aspirin® or Ribavirin), or a biochemical molecule such as a protein (for example troponin) or a nucleic acid molecule. When coupled to an appropriate molecule with binding affinity (which is also referred to as the analyte binding partner) for an analyte of interest, such as Ribavirin, the resulting probe can be used for example in a fluorescent immunoassay for monitoring the level of the drug in the plasma of a patient. In case of troponin, which is a marker protein for damage of the heart muscle, and thus in general for a heart attack, a conjugate containing an anti-troponin antibody and an inventive nanocrystal can be used in the diagnosis of heart attack.

The analyte can also be a complex biological structure including but not limited to a virus particle, a chromosome or a whole cell. For example, if the analyte binding partner is a lipid that attaches to a cell membrane, a conjugate comprising a nanocrystal of the invention linked to such a lipid can be used for detection and visualization of a whole cell. For purposes such as cell staining or cell imaging, a nanocrystal emitting visible light is preferably used. In accordance with this disclosure the analyte that is to be detected by use of a marker compound that comprises a nanoparticle of the invention conjugated to an analyte binding partner is preferably a biomolecule.

Therefore, in a further preferred embodiment, the molecule having binding affinity for the analyte is a protein, a peptide, a compound having features of an immunogenic hapten, a nucleic acid, a carbohydrate or an organic molecule. The protein employed as analyte binding partner can be, for example, an antibody, an antibody fragment, a ligand, avidin, streptavidin or an enzyme. Examples of organic molecules are compounds such as biotin, digoxigenin, serotronin, folate derivatives and the like. A nucleic acid can be selected from, but not limited to, a DNA, RNA or PNA molecule, a short oligonucleotide with 10 to 50 bp as well as longer nucleic acids.

When used for the detection of biomolecules a nanocrystal of the invention can be conjugated to the molecule having binding activity for an analyte via a linking agent. A linking agent as used herein, means any compound that is capable of linking a nanocrystal of the invention to a molecule having such binding affinity. Examples of the types of linking agents which may be used to conjugate a nanocrystal to the analyte binding partner are (bifunctional) linking agents such as ethyl-3-dimethylaminocarbodiimide or other suitable cross-linking compounds which are known to the person skilled in the art. Examples of suitable linking agents are N-(3-aminopropyl)3-mercapto-benzamide, 3-aminopropyl-trimethoxysilane, 3-mercaptopropyl-trimethoxysilane, 3-(trimethoxysilyl)propylmaleimide, and 3-(trimethoxysilyl)propyl-hydrazide. Prior to reaction with the linking agent, the surface of the nanocrystals can be modified, for example by treatment with glacial mercaptoacetic acid, in order to generate free mercaptoacetic groups which can then employed for covalently coupling with an analyte binding partner via linking agents.

Furthermore, the invention is also directed to a composition containing at least one type of nanocrystal as defined here. In one preferred embodiment, the nanocrystal is incorporated into a plastic bead or a latex bead. Furthermore, a detection kit containing a nanocrystal as defined here is also part of the invention.

In addition to the above described biomedical applications as fluorescent probes, the nanoalloys of the present invention can also be used as (short-wavelength) light-emitting devices. A preferred use is the use of the nanocrystals of the invention in color displays like computer monitors. For this application, nanocrystals can be embedded into plastic beads. A further example is their use in light emitting diodes. For this purpose, the nanoalloys can be incorporated into an organic matrix material, and then a substrate such as glass, metal or a polymer material is coated with a film comprising the nanoalloys (cf. Tessler et al, supra). A further application is the use of the nanocrystals in other optical device structures such as optical amplifiers and lasers as described by Klimov et al., supra. If nanoalloys such as CdHgTe, which emit in the infrared region of the electromagnetic spectrum, are used, applications in the telecommunication sector, for instance, as infrared optical amplifier medium are also within the scope of the present invention.

The invention is further illustrated by the following non-limiting examples and the attached drawings in which:

FIG. 1 shows absorption and photoluminescence (PL) spectra for bare CdSe nanocrystals and alloyed $Zn_xCd_{1-x}Se$ nanocrystals of the invention with the following Zn contents: (a) 0, (b) 0.28, (c) 0.44, (d) 0.55, and (e) 0.67 (FIG. 1A, 1B). As evident from FIGS. 1A,B with the increase of Zn content in the alloyed nanocrystals, the absorption and PL emission spectra are significantly blue-shifted. FIG. 1C shows corresponding high resolution transmission electron micrographs (HRTEM) of samples of these alloyed nanocrystal and of a standard CdSe nanocrystal. The scale bar in photograph (a) showing the CdSe nanocrystal is 2 nm;

FIG. 2 is 5 nm;

Figure 4:
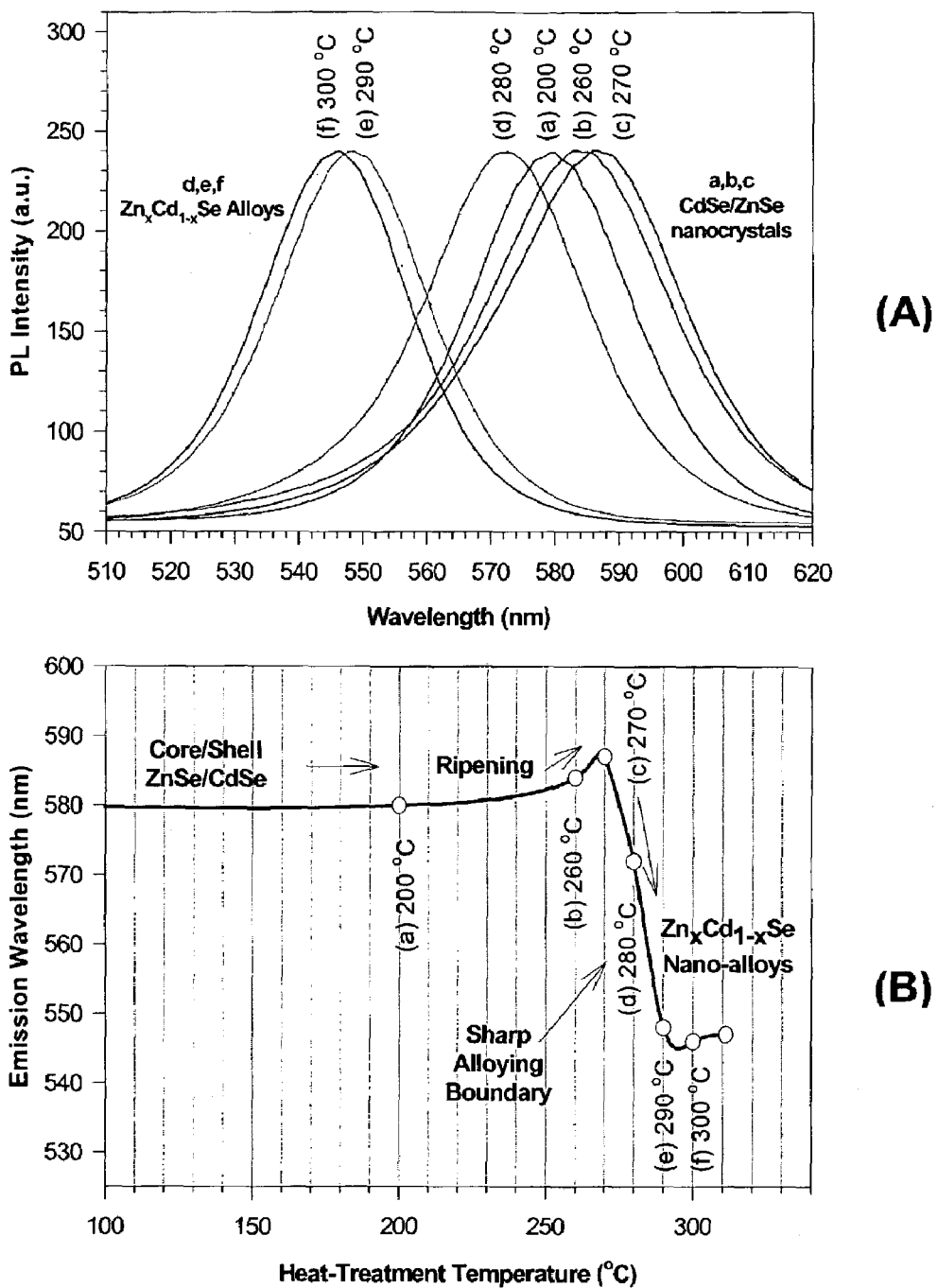

FIG. 4 shows the evolution of photoluminescence spectra in the progress of core-shell nanocrystals turning to alloyed nanocrystals under different temperatures for 10 min (FIG. 4A). In FIG. 4B the variation of the photoluminescence peak position of a core-shell CdSe/ZnSe nanocrystal having a 4.7 nm core and being coated with a 1.5 monolayer of ZnSe and its conversion into a ternary alloy after heating to from 260 to 270° C. for 10 min is shown. FIG. 4B thus shows the preparation of ternary nanocrystals according to the invention by use of thermal alloying.

Figure 5:
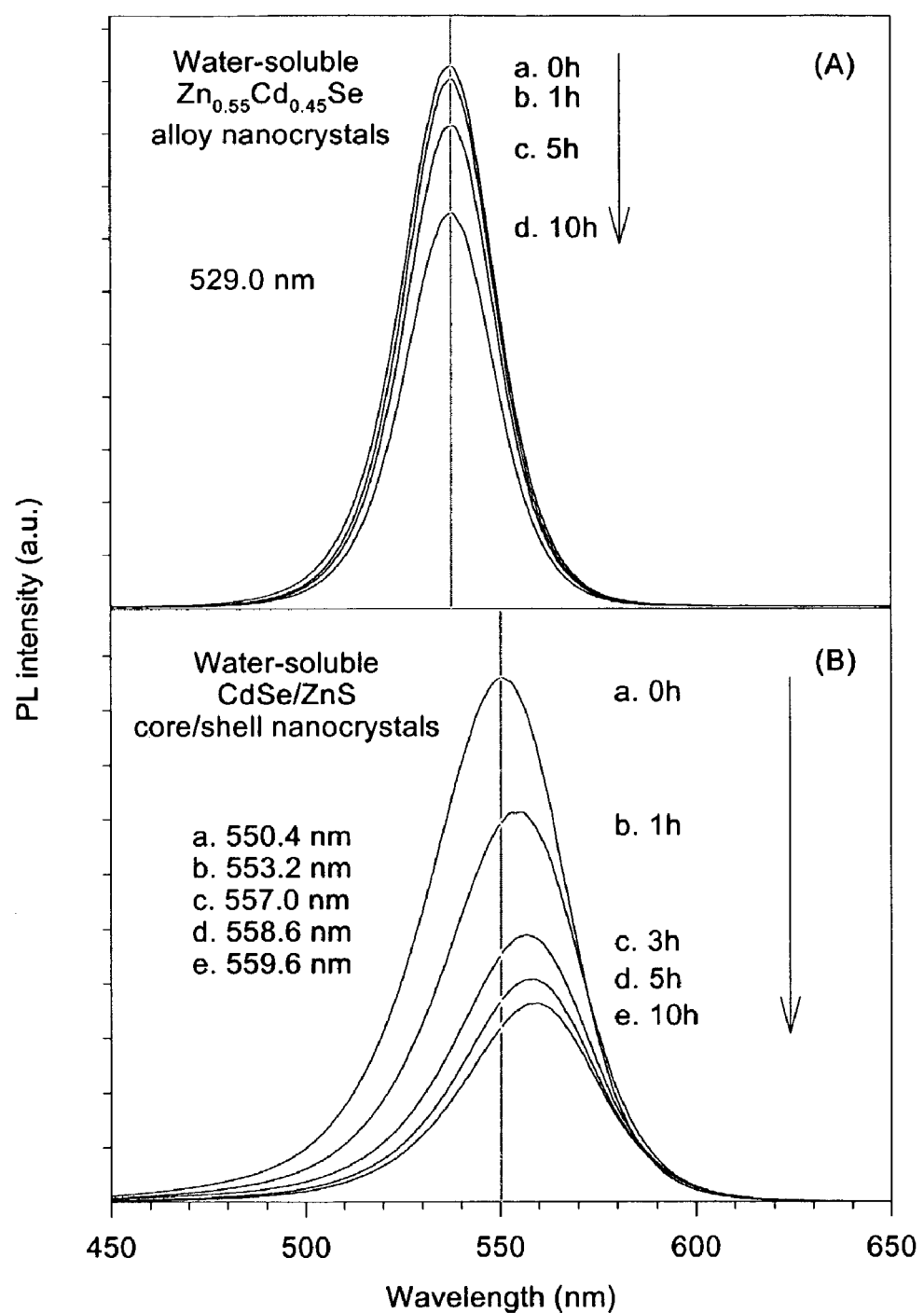
Figure 6:
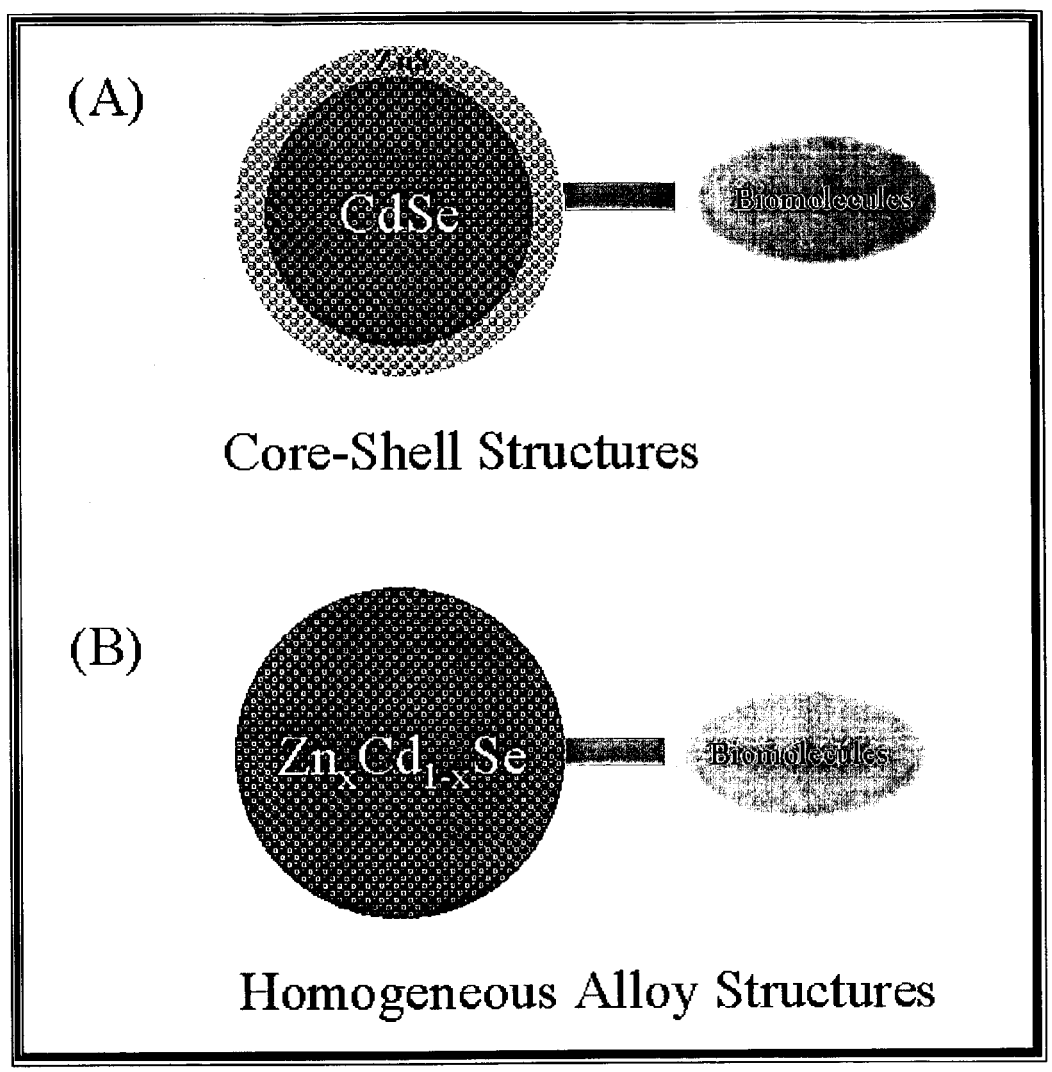

FIG. 5 shows the temporal evolution of the absorption spectra of ZnCdSe alloyed nanocrystals (FIG. 5A) and core-shell nanocrystals consisting of a CdSe core and a ZnS shell (FIG. 5B) in aqueous solutions when heated at 80° C. The photoluminescence intensity was measured in arbitrary units at time period of 0, (a), 1 (b), 3 (c), 5 (d) or 10 h (f);

FIG. 6 schematically shows a conventional ZnS capped CdSe core-shell nanocrystal (FIG. 6A), and a ternary nanocrystal of the present invention (FIG. 6B) that is covalently coupled to a biomolecule (such as a protein coupled by mercaptoacetic acid).

Figure 1:
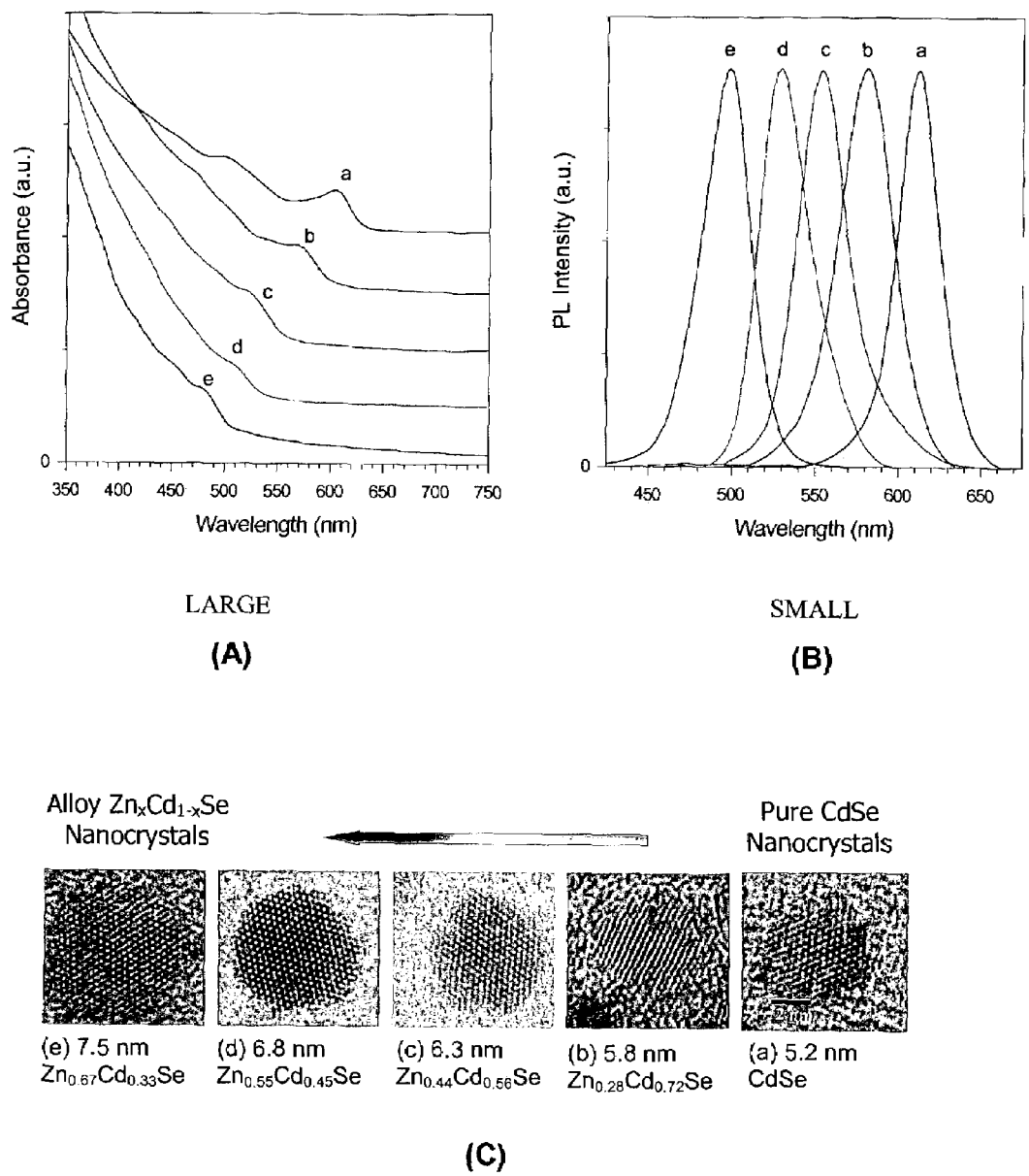
Figure 7:
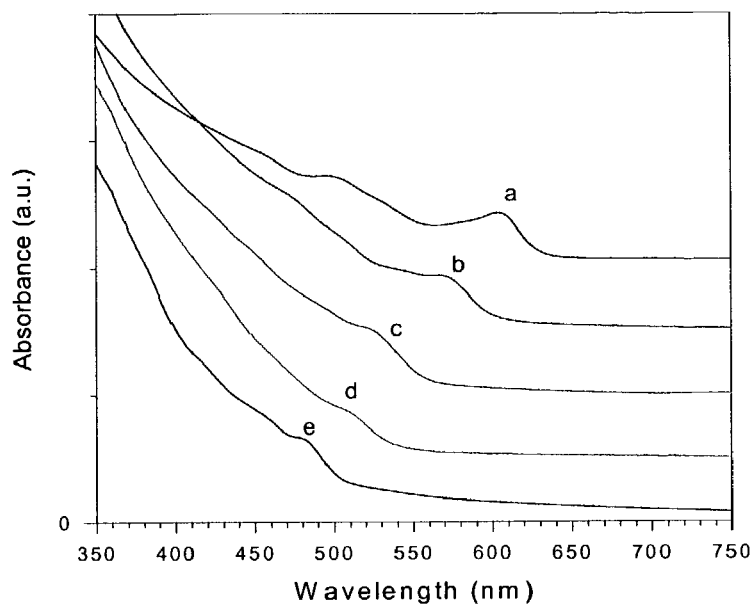
Figure 7:
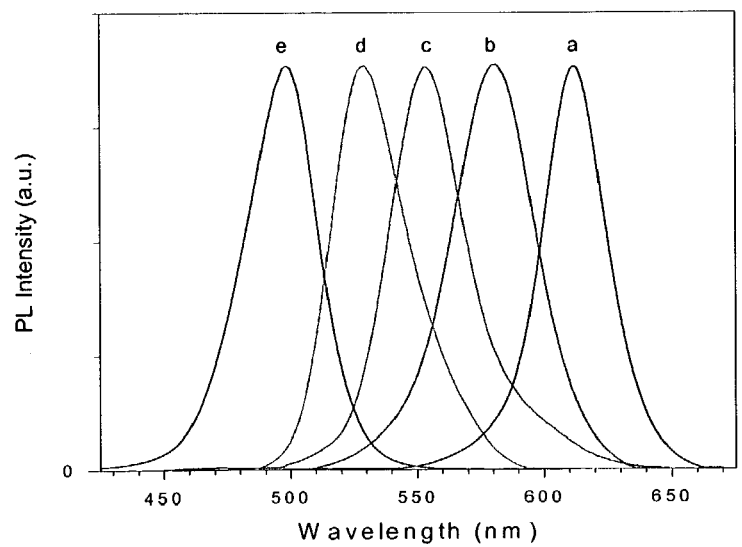

FIG. 7 shows the temporal evolution of UV-vis and PL spectra of $Zn_xCd_{1-x}Se$ nanoalloys prepared by quasi-one-pot preparation of Example 1.1 with increasing Zn mole fraction from 0 to 0.67 (the spectrum of which is also shown in FIG. 1).

Figure 8:
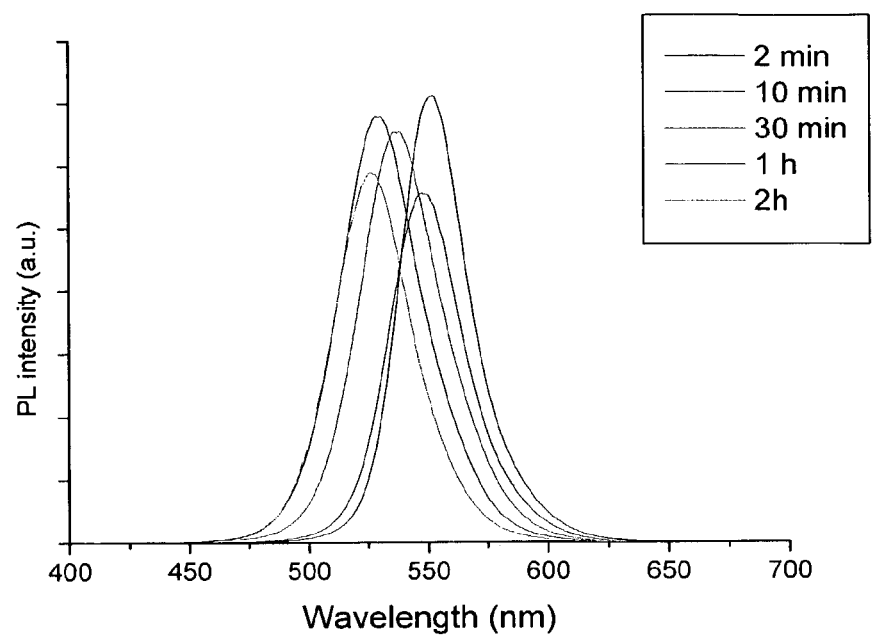
Figure 8:
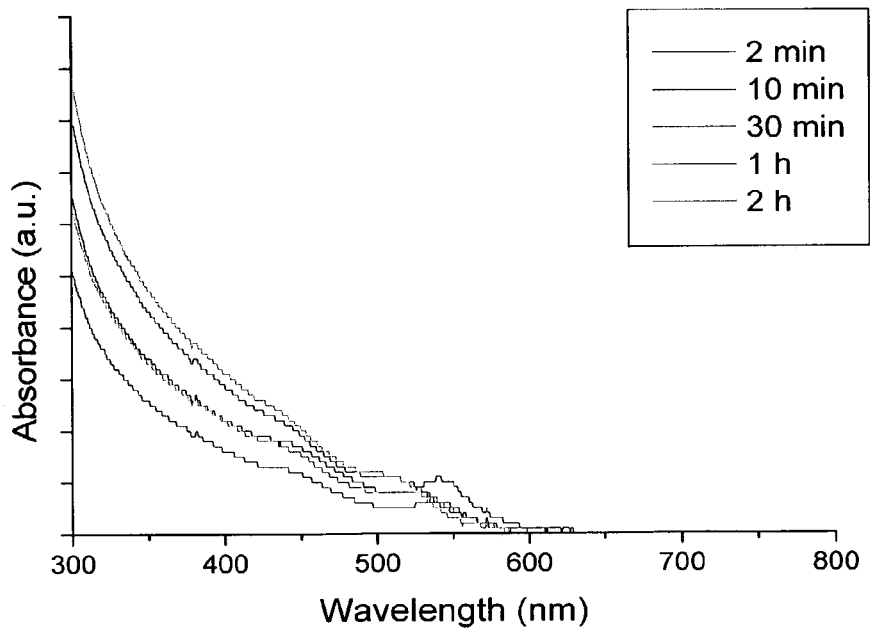

FIG. 8 shows the temporal evolution of UV-vis and PL spectra of $Zn_xCd_{1-x}Se$ nanoalloys prepared by the one-pot preparation of Example 1.2. As seen in FIG. 8A, during the course of the reaction the absorption maximum shifts from about 550 nm (after 2 min) gradually to about 525 nm (2 hours).

Figure 9:
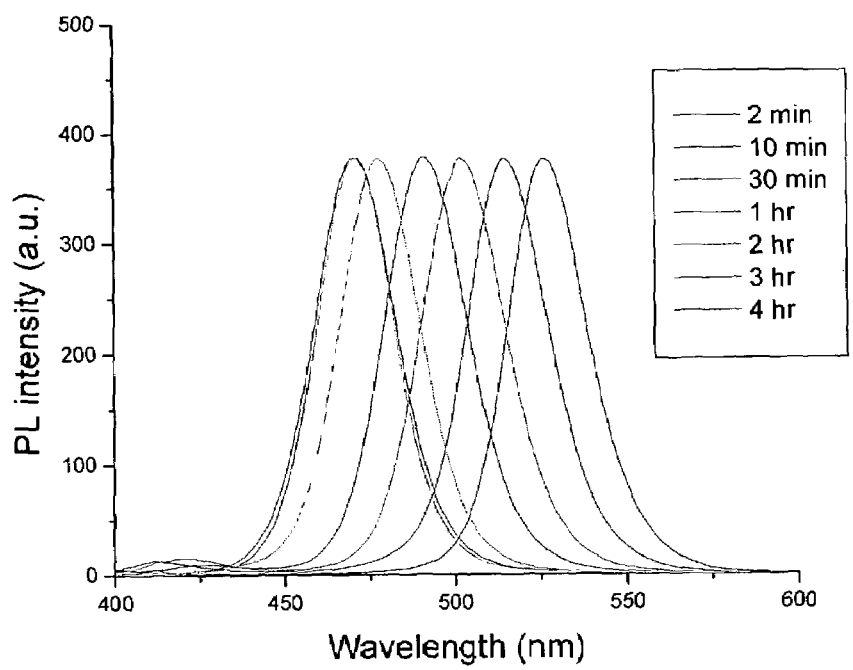
Figure 9:
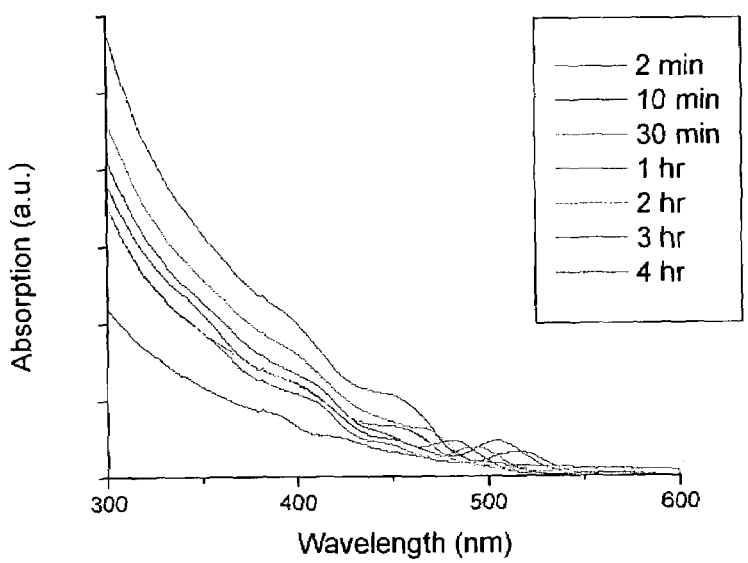

FIG. 9 shows the temporal evolution of UV-vis and PL spectra of $Zn_xCd_{1-x}Se$ nanoalloys prepared by the one-pot preparation of Example 1.3. As shown in FIG. 9A, during the course of the reaction the absorption maximum shifts from about 550 nm at the beginning of the reaction (2 min) gradually to about 425 nm after a reaction time of 4 hours).

Figure 10:
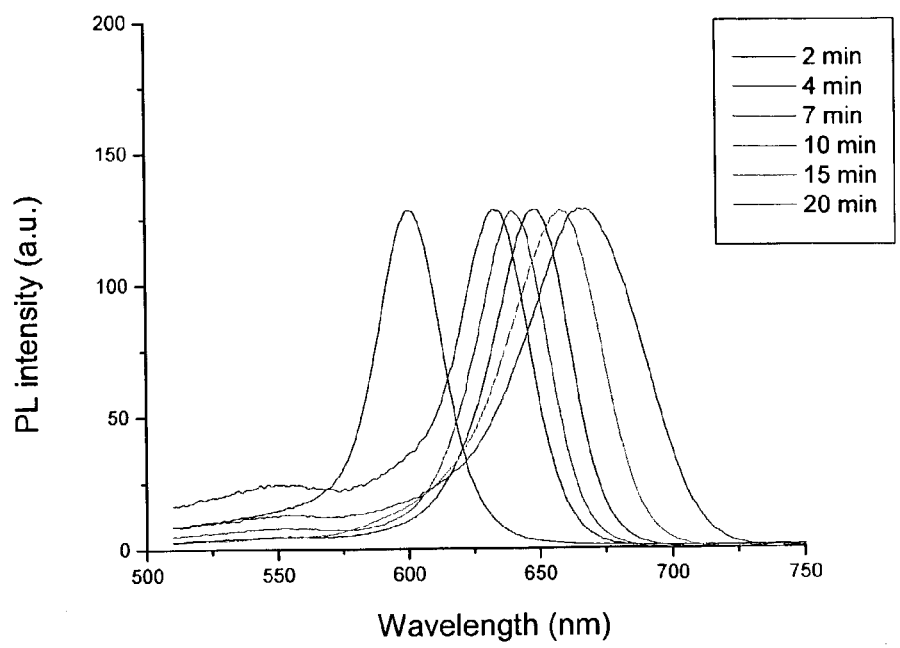
Figure 10:
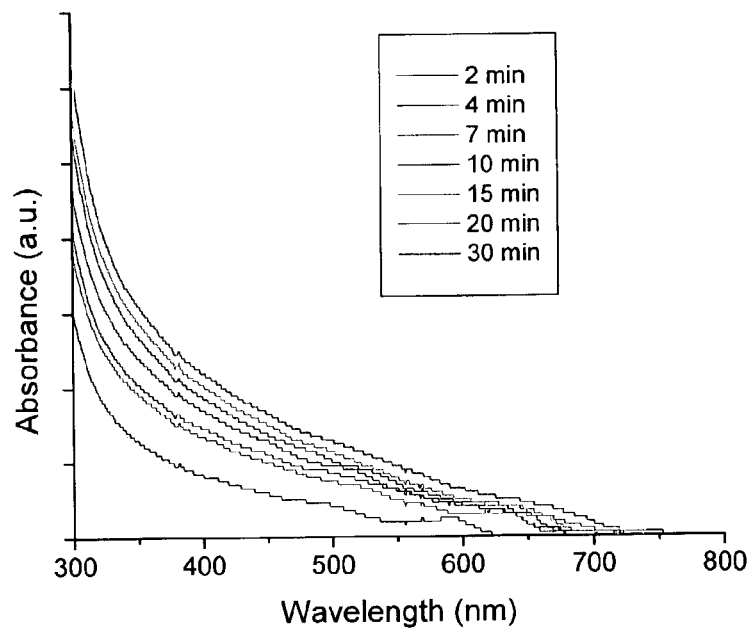

FIG. 10 shows the temporal evolution of UV-vis and PL spectra of $Hg_xCd_{1-x}Se$ nanoalloys prepared by the one-pot preparation of Example 2. Here, the absorption maximum shifts from about 600 nm (after 2 min) to about 650 nm after 20 min reaction time.

Figure 11:
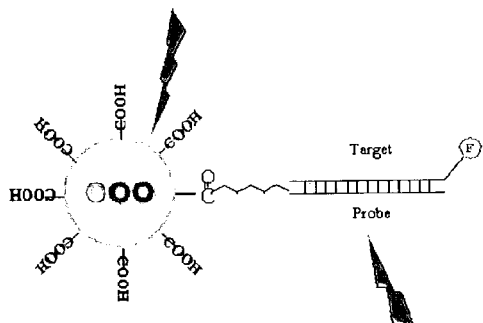
Figure 11:
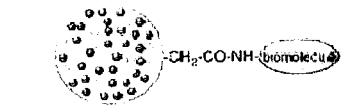
Figure 11:
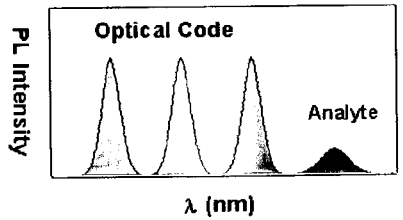

FIG. 11 shows a schematic representation of a multiplex analysis of biomolecules using the nanocrystals of the invention.

As will be seen from the following examples, in the present invention an effective high temperature synthetic strategy has been developed for the first time to make a series of high-quality nanoalloys such as $Zn_xCd_{1-x}Se$ alloy nanocrystals with emission wavelengths ranging from 460 to 630 nm by incorporating Zn and Se into starting CdSe nanocrystals (by diffusing Zn and Se into CdSe core particles). The composition-tunable emission across the visible spectrum has been systematically demonstrated over the composition of the $Zn_xCd_{1-x}Se$ (0<x<1) nanoalloys (the emission wavelength blue-shifts gradually with increasing Zn content). In this respect, the term "high quality" when used with reference to the nanocrystals (quantum dots) of the invention is preferably defined as narrow size distribution, good crystallinity, high luminescence efficiency and stability.

EXAMPLE 1

Synthesis of Ternary $Zn_xCd_{1-x}Se$ Nanocyrstals

Example 1.1

Synthesis of $Zn_xCd_{1-x}Se$ Nanocrystal Alloys Via a Quasi-One-Pot Reaction (Separate Two Steps)

The highly luminescent, nearly monodisperse ZnCdSe quantum dots of the invention were synthesized in a quasi "one pot procedure" as follows. It is noted that in this example M1 represents Cd and M2 represents Zn, although Zn is cited as first element in the formula $Zn_xCd_{1-x}Se$.

0.034 g (0.3 mmol) of cadmium powder and 0.34 g (1.2 mmol) of stearic acid were loaded in a 50 ml three-neck flask and heated to over 250° C. with stirring under argon atmosphere. After Cd was completely dissolved to get an optically clear solution, the reaction system was allowed to cool to room temperature. 10.0 g of trioctylphosphine oxide (TOPO), and 5.0 g of octadecylamine (ODA) were added to the flask, and the mixture was dried and degassed in the reaction vessel by heating to about 150° C. at about 1 Torr for about 1 h, flushing periodically with argon at least three times. The temperature of the reaction flask was then stabilized at 310° C. with stirring under 1 atm of argon. At this temperature, the excess amount of Se solution containing 0.12 g (1.5 mmol) of Se dissolved in 1.0 ml trioctylphosphine (TOP) was swiftly injected into the reaction flask in less than 0.1 second's period. After the injection, the temperature was set at 270–300° C. for the growth of binary CdSe nanocrystals. After the nanocrystals grew at this temperature for 5–10 minutes, the heater was removed and the flask was allowed to cool to room temperature.

A certain amount of the as-prepared CdSe reaction mixture (containing 0.1 mmol CdSe quantum dots) was taken out and was heated to 300° C. with stirring under argon flow. At this temperature, 0.5 ml of Zn(Et)$_2$ solution in TOP (containing 0.1–0.4 mmol Zn, depending on the desired amount of Zn in the nanocrystal) and 0.5 ml of Se solution in TOP (containing 0–0.2 mmol of Se) was added in three portions. Then the reaction mixtures was kept for 5–10 minutes at a temperature between 280 and 310° C. before the heater was removed to stop the reaction. The resulting alloy nanocrystals were precipitated by adding methanol (8 ml) into the reaction mixture, and isolated by centrifugation. Alloy nanocrystals were either stored as precipitate or dispersed in organic solvent (such as chloroform and toluene etc.) (see the $Zn_xCd_{1-x}Se$ PL and UV-vis spectra in FIG. 1 and FIG. 7).

For the determination of the relative content of Zn and Cd and the further characterization and measurements described in Example 3 the excess ligands and reaction precursors were completely removed by extensive purification prior to the further measurements described here. No further size selective purification was done for the samples described here.

The relative content of Zn and Cd in the nanocrystals was measured via Inductively-Coupled-Plasma atomic emission (ICP) by a standard HCl/HNO$_3$ digestion. The presence of Zn on the synthesized CdZnSe nanocrystals is unambiguously confirmed by EDS. By use of these methods, the preparation of ternary nanocrystals $Zn_xCd_{1-x}Se$ with Zn contents of (a) 0, (b) 0.28, (c) 0.44, (d) 0.55, and (e) 0.67 was confirmed.

In this respect, it is noted that the amounts of the elements M2 and A (or suitable precursor form(s) of these elements) which are exemplified here as Zn and Se needed to grow CdZnSe alloy can be determined by the desired Zn ratio in each target CdZnSe alloy dots.

For ternary alloys with a low Zn content, i.e. x<0.4, no Se precursor is needed (the unreacted Se in the CdSe reaction mixture can serve as the Se source); for high Zn content alloy (x>0.4), extra Se precursor should be complemented after part of Zn precursor added. The stoichiometric amounts of Zn and Se precursors lead to the desired ratio of Zn/Cd in each targeted $Zn_xCd_{1-x}Se$ nanoalloys. The synthesized ternary nanocrystals were precipitated by adding a methanol/acetone solvent mixture into the chloroform solution and isolated by centrifugation and decantation.

In control experiments, it was further confirmed that the reactivity of the CdSe reaction mixture depended on its history and that preparation of initial binary CdSe crystals as described above leads to the formation of ternary nanocrystals as disclosed here.

In a first control experiment, a similar direct-one-pot approach was taken. After the CdSe nanocrystals were grown at high temperature (270–300° C.) for the appropriate period (2–15 min), the Zn precursor was injected into this hot solution. The ZnSe-only photoluminescence peak was observed and the blue-shift for the starting CdSe photoluminescence peak was not observed (data not shown). This demonstrated that the Zn/Se nucleated independently and the CdSe—ZnSe alloy did not occur. However, if the Zn precursor was injected into the starting CdSe reaction solution after cooling to room temperature and then reheating to an appropriate temperature (260–340° C.), the alloying process occurred in this quasi one pot synthesis of the present invention (see above). This indicates that a Se-rich layer was formed on the surface in the starting CdSe dots during the low temperature process, which then helps the growth of ZnSe on the original dots and the subsequent diffusion into the particles and the alloying into ternary alloys.

In a second control experiment, the binary CdSe nanoparticles were synthesized as described above and cooled to room temperature. The solution was then heated up to a temperature between 260 and 340° C., for more than half hour. In this case, the alloying process did not occur either. This result indicates that the Se-rich layer which formed at cooling the reaction mixture, i.e. at low temperature, was unstable at high temperature and gradually eliminated after long time heating in the second step. Because of the absence of the Se-rich layer, the Zn will nucleate independently and no ternary alloy can form.

Example 1.2

Synthesis of $Zn_xCd_{1-x}Se$ Nanocrystal Alloys Via a One-Pot Reaction (Continuous Two Steps)

0.034 g (0.3 mmol) of cadmium powder and 0.34 mg (1.2 mmol) of stearic acid was loaded in a 50 ml three-neck flask and heated to over 250° C. under argon atmosphere. After Cd was completely dissolved to get an optically clear solution, the reaction system was allowed to cool to room temperature. 10.0 g of trioctylphosphine oxide (TOPO), and 5.0 g of octadecylamine (ODA) were added to the flask, and the mixture was dried and degassed in the reaction vessel by heating to about 150° C. at about 1 Torr for about 1 h, flushing periodically with argon at least three times. The temperature of the reaction flask was then stabilized at 310° C. with stirring under 1 atm of argon. At this temperature, Se solution containing 0.12 g (1.5 mmol) of Se dissolved in 1.0 ml of trioctylphosphine (TOP) was swiftly injected into the reaction flask, followed by ZnMe$_2$ (0.3–0.9 mmol). The system was then set at 270–310° C. for growth of the alloy $Zn_xCd_{1-x}Se$ nanocrystals to reach predetermined emission wavelength. After the alloy nanocrystals reached the desired emission wavelength, the heater was removed and the reaction mixture was cooled down to stop the reaction. When the temperature of the reaction mixture cooled to below 70° C., the alloy nanocrystals were precipitated by adding about 15 ml of methanol. The precipitate was separated by centrifugation and decantation. Alloy nanocrystals were either stored as precipitate or dispersed in organic solvent (such as chloroform and toluene etc). (see the $Zn_xCd_{1-x}Se$ PL and UV-vis spectra in FIG. 8).

If a solution containing a mixture of Se and Te is used dissolved in 1.0 ml of trioctylphosphine (TOP), quaternary nanoalloys $M1_{1-x}M2_xA_yB_{1-y}$ (for example ZnCdSeTe) of the invention are available.

Example 1.3

Synthesis of $Zn_xCd_{1-x}Se$ Nanocrystal Alloys Via One-Pot-Reaction Using CdMe$_2$ as Precursor 10.0 g of trioctylphosphine oxide and 5.0 g of hexadecylamine were loaded in a 50 ml three-neck flask and the mixture was dried and degassed in the reaction vessel by heating to about 150° C. at about 1 Torr for about 1 h, flushing periodically with argon at least three times. The temperature of the reaction flask was then stabilized at 310° C. with stirring under 1 atm of argon. At this temperature, 0.47 g (6 mmol) of selenium dissolved in 4.0 ml of TOP was added into the reaction system, followed by the quick injection of 1.0 mmol of $CdMe_2$ and then 1.0–3.0 mmol of $ZnMe_2$. The system was then set at 270–310° C. for growth of the alloy $Zn_xCd_{1-x}Se$ nanocrystals to reach a predetermined emission wavelength. After the alloy nanocrystals reached the desired emission wavelength, the heater was removed and the reaction mixture was cooled down to stop the reaction. When the temperature of the reaction mixture cooled to below 70° C., the alloy nanocrystals were precipitated by adding about 15 ml of methanol. The precipitate was separated by centrifugation and decantation. Alloy nanocrystals were either stored as precipitate or dispersed in organic solvent (such as chloroform and toluene etc. (see the $Zn_xCd_{1-x}Se$ PL and UV-vis spectra in FIG. 9).

EXAMPLE 2

Synthesis of $Hg_xCd_{1-x}Se$ Nanocrystal Alloys Via One-Pot-Reaction Using $CdMe_2$ as Precursor 10 g of trioctylphosphine oxide and 5 g of hexadecylamine were loaded in a 50 ml three-neck flask and the mixture was dried and degassed in the reaction vessel by heating to about 150° C. at about 1 Torr for about 1 h, flushing periodically with argon at least three times. The temperature of the reaction flask was then stabilized at 310° C. with stirring under 1 atm of argon. At this temperature, 0.39 g (5.0 mmol) of selenium dissolved in 4.0 ml of TOP was added into the reaction system, followed by the quick injection of 1.0 mmol of $CdMe_2$ and then 1.0–3.0 mmol of $HgMe_2$. The system was then set at 270–310° C. for growth of the alloy $Hg_xCd_{1-x}Se$ nanocrystals to reach a predetermined emission wavelength. After the alloy nanocrystals reached the desired emission wavelength, the heater was removed and the reaction mixture was cooled down to stop the reaction. When the temperature of the reaction mixture cooled to below 70° C., the alloy nanocrystals were precipitated by adding about 15 ml of methanol. The precipitate was separated by centrifugation and decantation. Alloy nanocrystals were either stored as precipitate or dispersed in organic solvent (such as chloroform and toluene etc.) (see the $Hg_xCd_{1-x}Se$ PL and UV-vis spectra in FIG. 10)

Also in this case, use of, for example, a mixture of Se and Te dissolved in TOP yields quaternary alloys of the invention such as HgCdSeTe.

EXAMPLE 3

Preparation of Ternary ZnCdSe Nanocrystals by Thermal Alloying

In an alternative method, the nanocrystals of the present invention were prepared by thermal alloying.

For this purpose, CdSe/ZnSe core-shell nanocrystals were prepared according to a literature standard method (Murray et al., supra). For comparison purposes, CdSe/CdS and CdSe/ZnS were prepared and subjected to a heat treatment as follows.

Synthesis of CdSe/ZnSe core shell nanocrystals: A certain amount of the as-prepared CdSe reaction mixture (containing ~0.02–005 mmol CdSe quantum dots) was taken out and was heated to 180–220° C. At this temperature, equimolar amounts of Zn/S precursor $Zn(Et)_2$ and $(TMS)_2S$ in 1–2 ml TOP were added dropwise to the vigorously stirring reaction mixture over a period of 10 to 15 min. After the addition was complete, the mixture was keep at this temperature and left stirring for half an hour. Then it was cooled down to room temperature.

The same batch of as-prepared CdSe/ZnSe samples was subjected to a 10 minutes heat treatment under different temperatures between 200° C. and 340° C. The alloying process was monitored by measuring the photoluminescence spectrum of the sample. Overall, the behavior of the nanocrystals was analyzed at seven predetermined temperatures yielding the following results.

Three clear steps of the alloying process were observed and are shown in FIG. 4 as follows: obvious ripening region of the core-shell nanocrystals between 200 and 270° C. with 7-nm red shift in emission from 580 to 587 nm, rapid alloying region with significant ~30-nm blue shift (a sharp drop in the emission wavelength) from 580 to 548 nm with a small temperature change between 270 and 290° C., and a stable region in emission wavelength after the alloying process. The alloying process occurs slowly at about 270° C. and becomes much faster with increasing temperature. It can complete within 10 min. if the temperature goes up beyond 290° C. This rapid alloying leads to no obvious initial red shift due to Ostwald ripening. These results clearly show that the ternary alloyed $Zn_xCd_{1-x}Se$ nanocrystals rapidly form at the temperature higher than 270° C. This very sharp temperature boundary at 270° C. is also called "alloying point" here, like a sharp melting or boiling point. Accordingly, the ternary nanocrystals of the invention can be prepared by heating core-shell nanocrystals at the alloying point or at a temperature above said alloying point for a sufficient period of time.

It is worth noting here that the growth temperatures (260–340° C.) are significantly lower than the melting temperature for bulk materials CdSe (1350° C.) and ZnSe (1100° C.). Alloying nevertheless takes place presumably because of the fact that nanocrystals have a much lower melting point compared to the bulk material and also presumably a lower temperature for the onset of inter-atomic diffusion. The original binary CdSe nanocrystals are synthesized using an excess of Se. Therefore, they may have a Se rich surface in the mother solution, which may be helpful for the injected Zn source to bond with the mother particle surface and to diffuse into the particle.

EXAMPLE 4

Characterization of Ternary $Zn_xCd_{1-x}Se$ Nanocrystals

The ternary $Zn_xCd_{1-x}Se$ nanocrystals prepared in Example 1 were further characterized with respect to their physical and functional properties. The photoluminescence properties for the nanoalloys (with PL efficiency of 70–85%, FWHM=22–30 nm) are comparable to or better than those for the best reported CdSe QDs. Indeed, they have much better PL properties in the blue spectral range. Moreover, the nanoalloys retain their high luminescence (with PL efficiency of over 40%) when dispersed in aqueous solutions and maintain a consistent peak shape and spectral position under rigorous experimental conditions. These novel optical properties render quantum dots ideal fluorophores for ultrasensitive, multicolor, and multiplexing applications in molecular biotechnology and bioengineering.

Example 4.1

Blue-Shift for Alloying Evidence and Composition-Controlled Optical Properties

Figure 2:
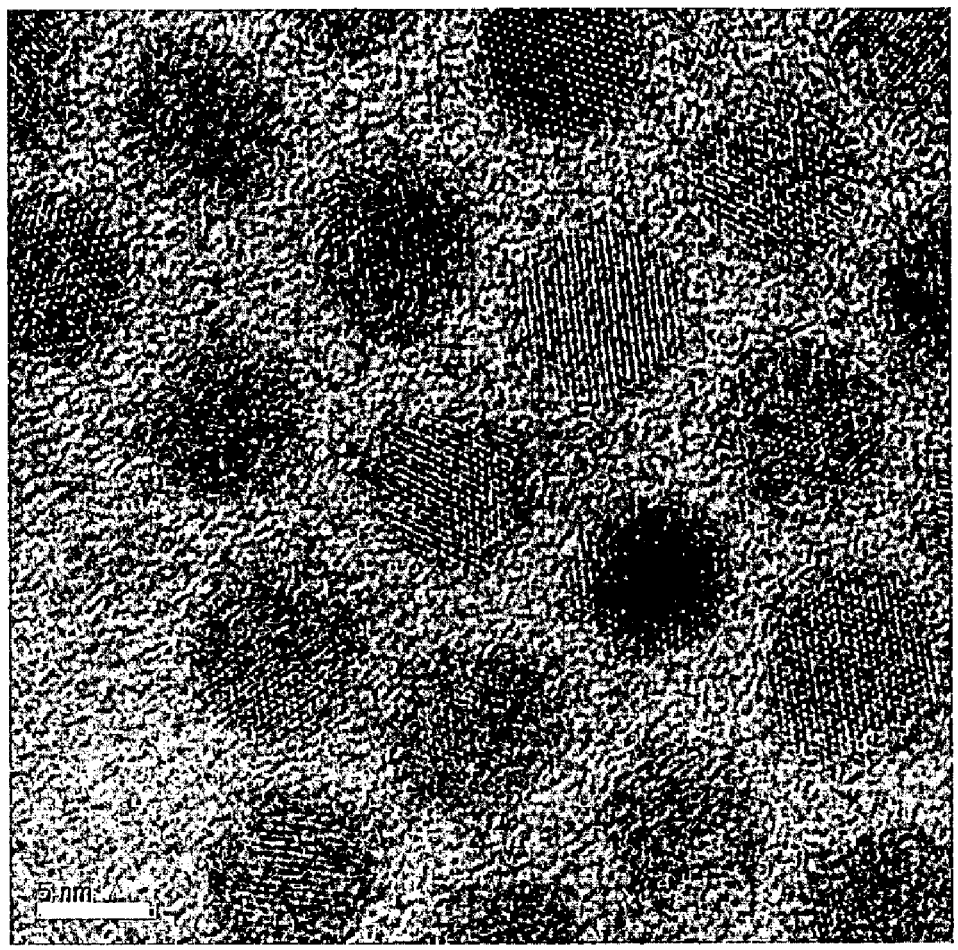
FIG. 2 show a wide-field high-resolution transmission electron micrograph (HRTEM) of alloyed $Zn_{0.67}Cd_{0.33}Se$ of the invention (sample e as shown in FIG. 1). The scale bar is

The most direct and immediate probes for alloying are the absorption and fluorescence spectra. FIGS. 1a & 1b show absorption and fluorescence spectra for $Zn_xCd_{1-x}Se$ alloys with different Zn ratios initiated from the same CdSe particles having diameter of 5.2 nm. As shown in FIG. 1c, the representative images of CdSe and $Zn_xCd_{1-x}Se$ show that the nanoalloys become larger from 5.2, 5.8, 6.3, 6.8, to 7.5 nm with increasing Zn mole fractions from 0, 0.28, 0.44, 0.55, to 0.67, respectively. The proportional increase of particle size with the Zn content offers further alloying evidence to support the formation of narrow size distributed alloys (cf. also FIG. 2).

FIG. 1a and FIG. 1b show absorption and fluorescence spectra for the as-prepared $Zn_xCd_{1-x}Se$ nanoalloys by incorporating wider band gap ZnSe into narrow band gap CdSe nanocrystals. With increasing ZnSe mole fractions from 0 to 0.67, a significant about 110–120 nm blue shift of the first excitonic absorption profile and PL emission wavelength is clearly observed. This systematic blue shift is evidence for alloying of intermixing ZnSe with CdSe nanocrystals, i.e. that the resulting nanocrystals arise from alloying but not shell growth.

The resulting $Zn_xCd_{1-x}Se$ nanoalloys have comparable optical properties in absorption but significantly narrower emission bandwidth (22–30 nm at FWHM) compared to the starting CdSe nanocrystals. The lack of inhomogeneous emission broadening indicates the uniform formation of monodispersed alloy nanocrystals. The photoluminescence quantum yield of the nanocrystals of the invention was determined to be around 65–85% (calculated by comparing the integrated emission to that of organic dyes), which is comparable the best result for red-luminescent CdSe nanocrystals. The corresponding emission efficiency in chloroform increases from 70% to 85% with this increase of ZnSe.

Example 4.2

Characterization of the Ternary Nanocrystals by Wide-Field High-Resolution Transmission Electron Micrograph (HRTEM)

High Resolution TEM (HRTEM) allows qualitative probing of the internal structure of the composite nanocrystals and determination of the average size, size distribution, and aspect ratio. Representative HRTEM images of the starting CdSe nanocrystals are presented in FIG. 1C and FIG. 2.

The nanocrystals in the micrographs show well-resolved lattice fringes with measured lattice spacing in the original CdSe similar to the $Zn_xCd_{1-x}Se$ nanocrystals. The wurtzite crystal structure is resolved by the fringe contrast, and is also clearly revealed by the Fourier transform of the image presented in FIG. 2. The alloyed nanocrystals are very nearly spherical dots and remained fully crystalline upon ZnSe incorporation. There was no evidence for any defects traversing the entire nanocrystals. Indeed, the main indication of alloying is the increase of the nanocrystals' diameter (from original 4.7 to 7.2 nm). The particle size determined from TEM can be used to estimate the ZnSe content in the $Zn_xCd_{1-x}Se$ nanocrystals. The calculated Zn content accorded with the measured value by ICP method.

Evidence for the alloying also arises from the homogeneous image contrast throughout the nanocrystals except for a smooth drop-off near the edge of the nanocrystals (due to a different thickness). If they formed a core-shell structure, a noticeable stepwise drop-off in image contrast across the first few outlayers should be observed due to the fewer electrons per unit cell in ZnSe than that in CdSe.

Example 4.3

Figure 3:
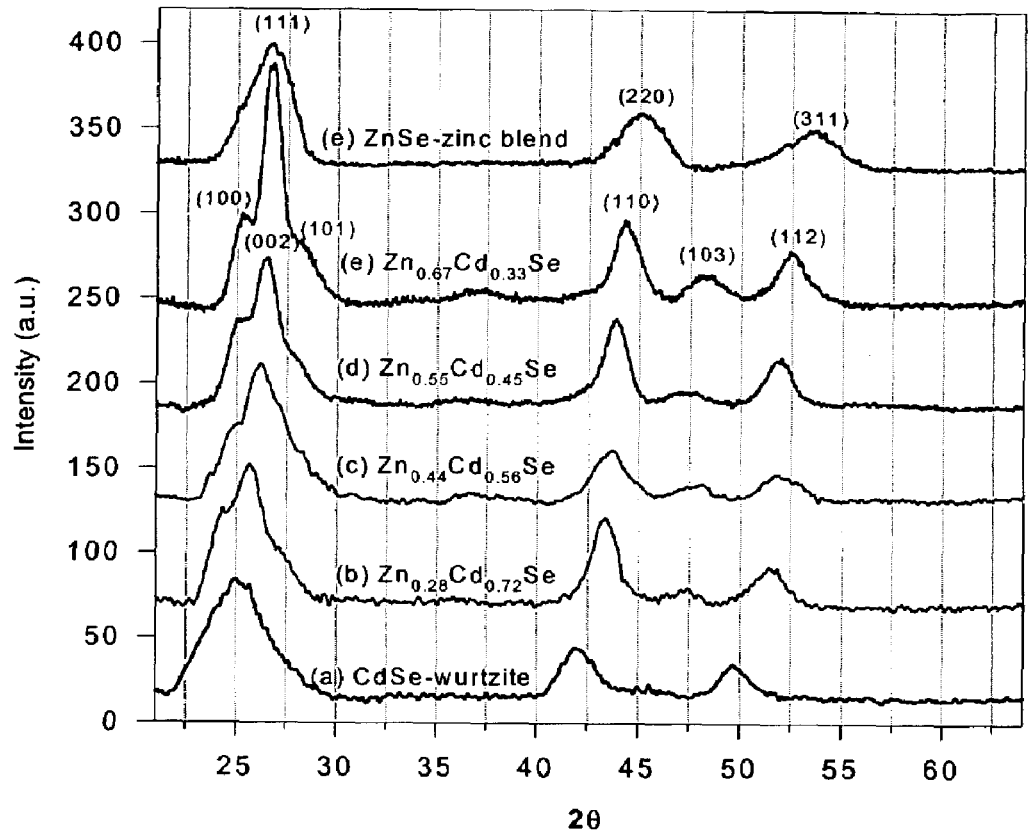
FIG. 3 shows X-ray powder diffraction patterns of pure CdSe and ZnSe nanocrystals and $Zn_xCd_{1-x}Se$ alloy nanocrystals.

Structrural Characterization of the Alloyed Nanocrystals by X-Ray Powder Diffractometry The nanoparticles were further characterized by powder X-ray diffractometry (XRD). The obtained patterns for the starting CdSe, 4.6 nm in diameter, and for $Zn_xCd_{1-x}Se$ with increasing Zn content are presented in FIG. 3. The CdSe XRD pattern consists of the characteristic peaks of wurtzite, which are broadened because of the finite crystalline domain size. With the incorporation of ZnSe, the diffraction peaks shift to larger angles consistent with the smaller lattice constant for ZnSe compared with CdSe. In addition, the diffraction peaks narrow upon the incorporation of ZnSe. Considering the shifts in peak position and the narrowing, the XRD patterns could be indicative of alloying. It is evident that for a homogenous alloy the diffraction peaks should narrow with increasing particle sizes. If they had formed a core-shell structure, the narrowing trend in XRD peak widths could not have been observed.

An epitaxial alloying formation mechanism is suggested here. It includes initially epitaxial formation of ZnSe on the CdSe, followed by alloying by heat diffusion of Zn into CdSe cores. Wurtzite CdSe served as template to form $Zn_xCd_{1-x}Se$ alloys, which retain the wurtzite structure of the CdSe lattice and also retain the high quality properties of CdSe such as high quantum yield. Actually the most stable form of ZnSe is cubic zincblende. However, only one-type of wurtzite crystal was observed in alloyed ZnCdSe nanocrystals of the invention. No phase segregation and separated nucleation of ZnSe was observed. These experimental results show no evidence of ZnSe nanocrystals, thus also confirming the presence of a homogenous ternary nanoalloy.

Example 4.4

Functional Analysis of the Photoluminescent Properties of the Ternary ZnCdSe Nanocrystals For examination of the photoluminescent properties of the ternary ZnCdSe nanocrystals, a ternary nanocrystal of 6.3 nm emitting green light was compared with a 2.3-nm core-shell structured ZnS/CdSe nanocrystal. For this purpose the nanocrystals were heated at 80° C. in air-saturated aqueous solution for more than 5 hours and the photoluminescence was monitored. The results of this experiment are shown in FIG. 5B. Only about 10% decrease in PL emission intensity was observed for the $Zn_{0.55}Cd_{0.45}Se$ nanoalloys while ~50% decrease was found for the core-shell ZnS/CdSe nanocrystals. Furthermore, the emission maximum (529 nm) and the band-width of the ternary nanocrystals remained the same whereas the core-shell nanocrystals underwent both a red-shift in the emission maximum and a strong decrease in the photoluminescence yield, indicating their decomposition under these conditions.

From this experiment it gets evident that the ternary nanocrystals according to the present invention have significantly improved chemical stability and improved photoluminescence properties compared to conventional core-shell nanocrystals.

EXAMPLE 5

Surface Modification of the Ternary Nanocrystals

Ternary CdZnSe nanocrystals of the invention are dissolved in chloroform and are reacted with mercaptoacetic acid solution under vigorous shaking and mixing for half hour, then dissolved by dropwise addition of tetraethylammonium hydroxide solution. After shaking, the chloroform and water layers separated spontaneously. The aqueous layer, which contained mercapto-coated nanocrystals, was extracted.

The nanocrystals so obtained carried free mercaptoacetic groups which can be used for covalently coupling of compounds such as proteins, peptides, or organic molecules to the nanocrystals, rendering them suitable for use as probes in various applications. For example, polypeptides such as antibodies, avidin, transferrin or small ligands such as biotin or folate compounds can be coupled to the nanocrystals via cross-linking agents such as carbodiimides, for example, ethyl-3-(dimethylaminopropylcarbodiimde), as described in Chan and Nie, supra or Hermanson, Bioconjugates Techniques, Academic Press, New York, 1996. Such probes can then be used as marker or cell staining compounds.

EXAMPLE 6

Multiplexing Analysis of Biomolecules Using the Nanocyrstals of the Invention

A quantum dot emits light of a specific color or wavelength, depending on its size. The intensity of the light given out also varies with the quantity of dots. The basic concept as shown in the scheme II of FIG. 12 for multiplexed bioanalysis is to develop a large number of different colored smart nanostructures that have not only molecular recognition abilities but also built-in codes for rapid target identification. For example, the surface of a polymer bead is conjugated to biomolecular probes such as oligonucleotides and antibodies, while an identification code using nanoparticles emitting at a different wavelength is embedded in the bead's interior. By integrating molecular recognition and optical coding, each bead can be considered a "chemical lab (lab-on-a-bead)" that detects and analyzes a unique sequence or compound in a complex mixture.

For 24-bit true color display like computer monitors, over one million colors are required through the combination of the three primary colors RGB (red, green, and blue). In the lab-in-a-bead approach, the used plastic beads are coded by controlling the size and number of the ternary or quaternary dots of the present invention in the beads. For instance, a system that uses 3 colors of dots each with 10 intensity levels would theoretically have beads with about 1000 different combination of colors and intensities. With 5 colors of dots, the number of combinations increases to 100,000. These beads are attached to short strands of DNA or protein that are mixed with the target DNA or protein. Those that match the target will be attached to it. By reading the light codes of the beads attached to each matching strand, it is possible to determine the make-up of the target DNA or proteins. By use of about 30,000 to about 40,000 discriminated color-beads, it is possible to encode the complete human genome at a single test.

To demonstrate the use of quantum dot-tagged beads for biological assays, a model DNA hybridization system was designed (Scheme III in FIG. 12) using oligonucleotide probes and triple-color encoded beads. Target DNA molecules were labeled with a fluorescent dye or a quantum dot of the invention. Optical spectroscopy at the single-bead level yielded both the coding and the target signals. The coding signals identified the DNA sequence, whereas the target signal indicated the presence and the abundance of that sequence.

Conventional technologies include the lab-on-a-chip, or biochip, in which miniature DNA-decoding troughs are etched onto flat surfaces. The lab-on-a-bead technology using the nanocrystals of the invention is more flexible in target selection (e.g. adding new genes or single-nucleotide mutations), faster in binding kinetics (similar to that in homogeneous solution), and cheaper in production. This technology provides high sensitivity and high reaction speeds for many types of multiplexed assays, from immunoassays to SNP detection, as well as easy-to-use, high-throughput, and low-cost assays. This multiplexing technology combines the advantages of quantum dots with those of microfluidics and microarrays.

The invention claimed is:

1. A nanocrystal consisting of a homogeneous ternary alloy having the composition selected from the group consisting of $Zn_xCd_{1-x}Se$ and $Zn_xCd_{1-x}S$,
   obtainable by a process comprising
   i) forming a binary nanocrystal CdSe or CdS by heating a reaction mixture containing the element Cd in a form suitable for the generation of a nanocrystal to a suitable temperature T1, adding at this temperature the element Se or S in a form suitable for the generation of a nanocrystal, heating the reaction mixture for a sufficient period of time at a temperature suitable for forming said binary nanocrystal CdSe or CdS and then allowing the reaction mixture to cool, and
   ii) reheating the reaction mixture, without precipitating or isolating the formed binary nanocrystal CdSe or CdS, to a suitable temperature T2, adding to the reaction mixture at this temperature a sufficient quantity of the element Zn in a form suitable for the generation of a nanocrystal, then heating the reaction mixture for a sufficient period of time at a temperature suitable for forming said ternary nanocrystal $Zn_xCd_{1-x}Se$ or $Zn_xCd_{1-x}S$ and then allowing the reaction mixture to cool to room temperature, and isolating the ternary nanocrystal $Zn_xCd_{1-x}Se$ or $Zn_xCd_{1-x}S$.

2. The nanocrystal of claim 1 with $0.001<x<0.999$.

3. The nanocrystal of claim 2 with $0.5<x<0.95$.

4. The nanocrystal of claim 1 with $0.15<x<0.85$.

5. The nanocrystal of claim 4 with $0.2<x<0.8$.

6. The nanocrystal of claim 1 incorporated into a plastic bead.

7. A detection kit containing a nanocrystal as defined in claim 1.

8. The nanocrystal of claim 1, wherein the homogenous ternary alloy has the composition $Zn_xCd_{1-x}Se$.

9. The nanocrystal of claim 1, wherein the homogenous ternary alloy has the composition $Zn_xCd_{1-x}S$.

10. The nanocrystal of claim 1 conjugated to molecule having a binding affinity for a given analyte.

11. The nanocrystal of claim 10, wherein the molecule having a binding affinity for a given analyte has a binding affinity to a biomolecule.

12. The nanocrystal of claim 11, wherein the molecule having a binding affinity for an analyte is a molecule selected from the group consisting of a protein, a peptide, a compound having features of an immunogenic hapten, a nucleic acid, a carbohydrate, and an organic molecule.

13. The nanocrystal of claim 12, wherein the nanocrystal is conjugated to said molecule having a binding activity for an analyte via a linking agent.

14. A process for detecting an analyte, comprising contacting an analyte with a molecule having a binding affinity for the analyte, the molecule being conjugated to the nanocrystal of claim 1.

15. A process of producing a nanocrystal consisting of a homogeneous ternary alloy having the composition selected from the group consisting of $Zn_xCd_{1-x}Se$ and $Zn_xCd_{1-x}S$, said process comprising
  i) forming a binary nanocrystal CdSe or CdS by heating a reaction mixture containing the element Cd in a form suitable for the generation of a nanocrystal to a suitable temperature T1, adding at this temperature the element Se or S in a form suitable for the generation of a nanocrystal, heating the reaction mixture for a sufficient period of time at a temperature suitable for forming said binary nanocrystal CdSe or CdS and then allowing the reaction mixture to cool, and
  ii) reheating the reaction mixture, without precipitating or isolating the formed binary nanocrystal CdSe or CdS, to a suitable temperature T2, adding to the reaction mixture at this temperature a sufficient quantity of the element Zn in a form suitable for the generation of a nanocrystal, then heating the reaction mixture for a sufficient period of time at a temperature suitable for forming said ternary nanocrystal $Zn_xCd_{1-x}Se$ or $Zn_xCd_{1-x}S$ and then allowing the reaction mixture to cool to room temperature, and isolating the ternary nanocrystal $Zn_xCd_{1-x}Se$ or $Zn_xCd_{1-x}S$.

16. The process of claim 15, wherein the reaction mixture in i) is allowed to cool to a temperature below 100° C. after formation of the binary nanocrystal CdSe or CdS.

17. The process of claim 15 with $0.001<x<0.999$.

18. The process of claim 17 with $0.1<x<0.95$.

19. The process of claim 15, wherein the homogeneous ternary alloy has the composition $Zn_xCd_{1-x}Se$.

20. The process of claim 15 with $0.15<x<0.85$.

21. The process of claim 20 with $0.2<x<0.8$.

22. The process of claim 15, wherein the reaction mixture in i) is heated to a temperature T1 between 150° C. and 400° C.

23. The process of claim 15, wherein the reaction mixture in ii) is heated to a temperature T2 between 200° C. and 400° C.

24. The process of claim 15, wherein in ii) a second quantity of the element Se or S is added for the formation of the ternary nanocrystal.

25. The process of claim 15, wherein the homogeneous ternary alloy has the composition $Zn_xCd_{1-x}S$.

* * * * *